United States Patent
Maejima

(10) Patent No.: US 7,929,344 B2
(45) Date of Patent: *Apr. 19, 2011

(54) SEMICONDUCTOR MEMORY DEVICE HAVING STACKED GATE INCLUDING CHARGE ACCUMULATION LAYER AND CONTROL GATE

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/403,064

(22) Filed: Mar. 12, 2009

(65) Prior Publication Data

US 2009/0237992 A1 Sep. 24, 2009

(30) Foreign Application Priority Data

Mar. 19, 2008 (JP) ................. 2008-071580

(51) Int. Cl.
  G11C 16/02 (2006.01)
  G11C 16/06 (2006.01)
(52) U.S. Cl. .......... 365/185.03; 365/185.21; 365/185.23
(58) Field of Classification Search .................... None
  See application file for complete search history.

(56) References Cited

U.S. PATENT DOCUMENTS

| 7,443,757 B2 | 10/2008 | Cernea et al. |
| 2002/0139999 A1* | 10/2002 | Hirano ........................... 257/200 |
| 2004/0057318 A1* | 3/2004 | Cernea et al. .................. 365/226 |
| 2007/0014152 A1* | 1/2007 | Shibata et al. ........... 365/185.11 |
| 2008/0094903 A1 | 4/2008 | Maejima et al. |
| 2009/0161433 A1* | 6/2009 | Lee et al. .................. 365/185.12 |

FOREIGN PATENT DOCUMENTS

| JP | 2006-500727 | 1/2006 |
| JP | 2006-79803 | 3/2006 |
| JP | 2009-163793 | 7/2009 |
| WO | WO 2006/107706 A1 | 10/2006 |

* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

A semiconductor memory device includes a memory cell, a bit line, a source line, a detection circuit, and a sense amplifier. The memory cell holds or more levels of data. The bit line is electrically connected to a drain of the memory cell. The source line is electrically connected to a source of the memory cell. The detection circuit detects a current flowing through the source line during a read operation and a verify operation on the data. The sense amplifier reads the data by sensing a current flowing through the bit line during the read operation and the verify operation. Whether or not the sense amplifier reads the same data plural times is determined according to a current amount detected by the detection circuit.

20 Claims, 27 Drawing Sheets

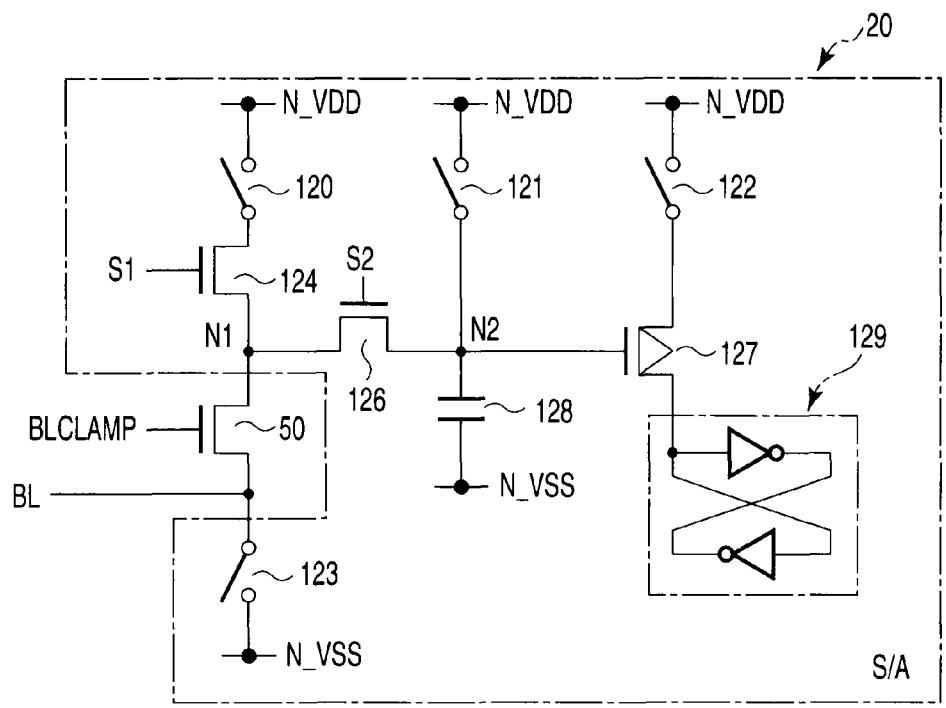
F I G. 4
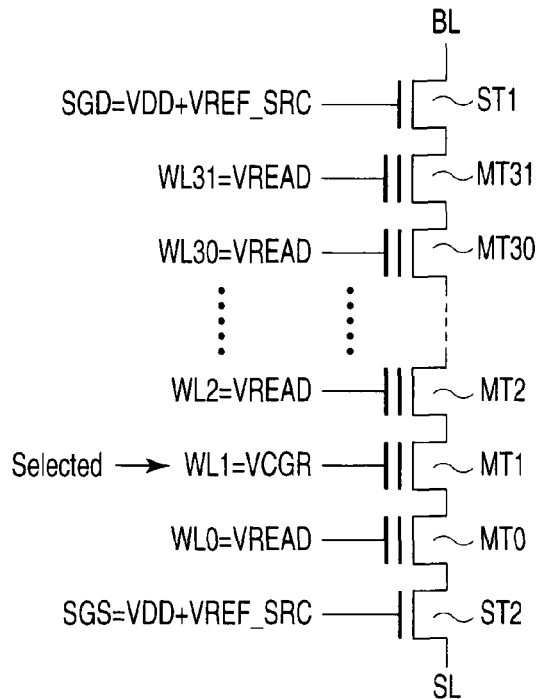
F I G. 5

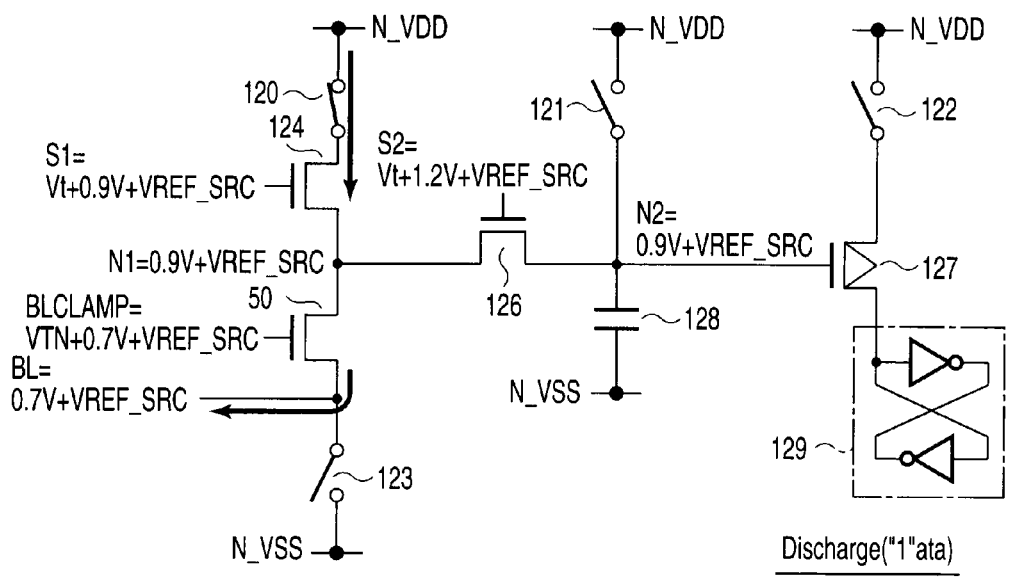
F I G. 10
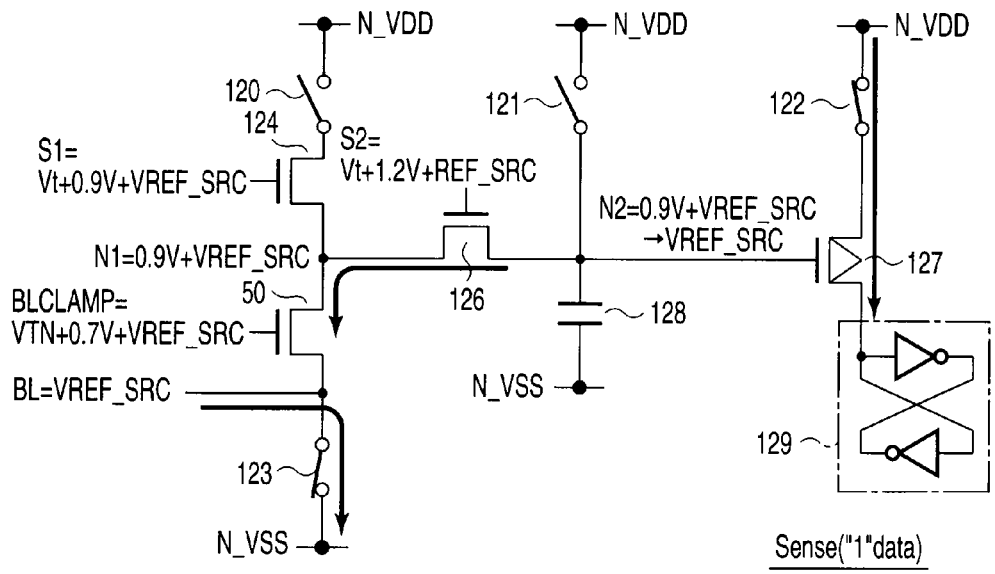
F I G. 11

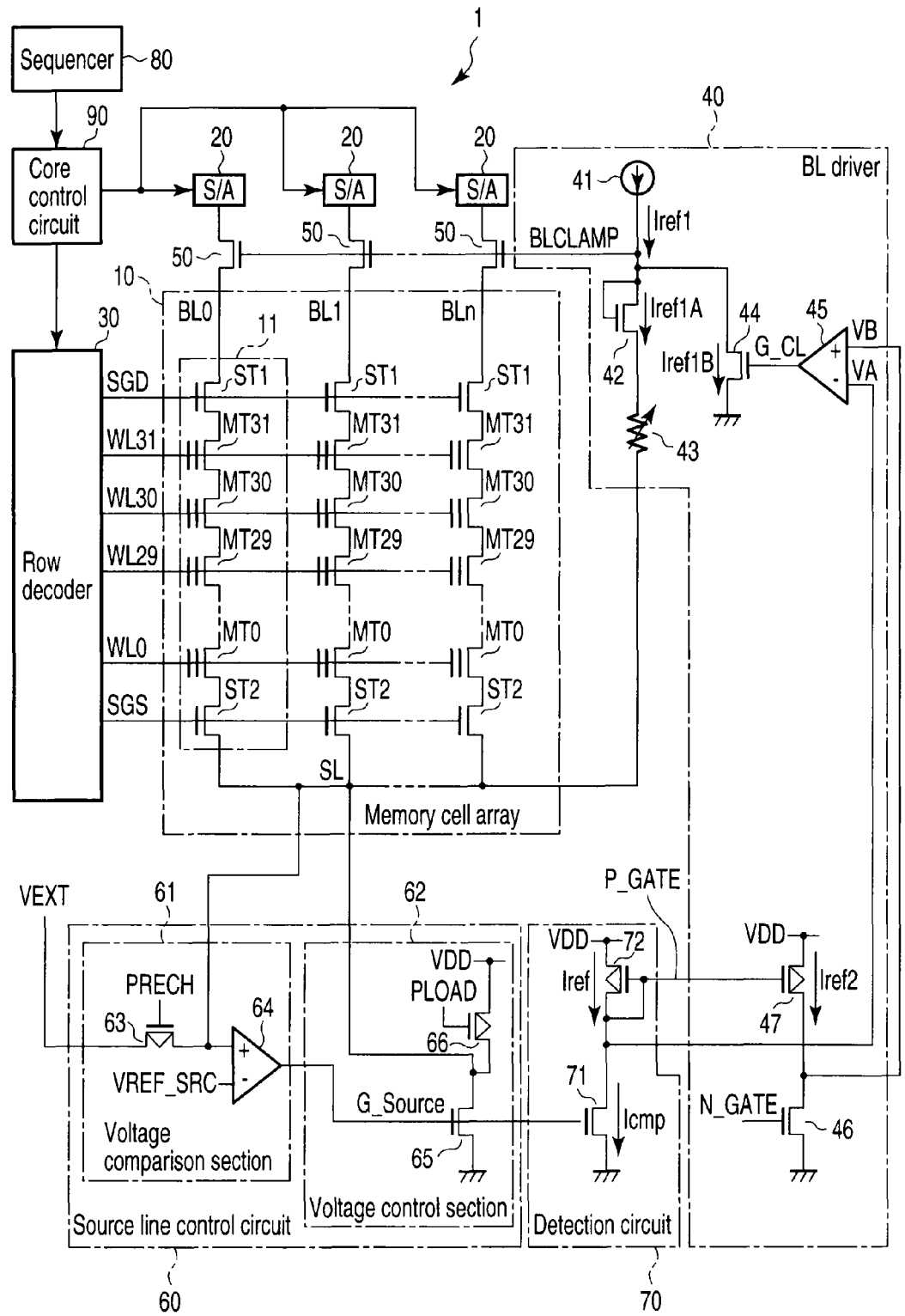
F I G. 24

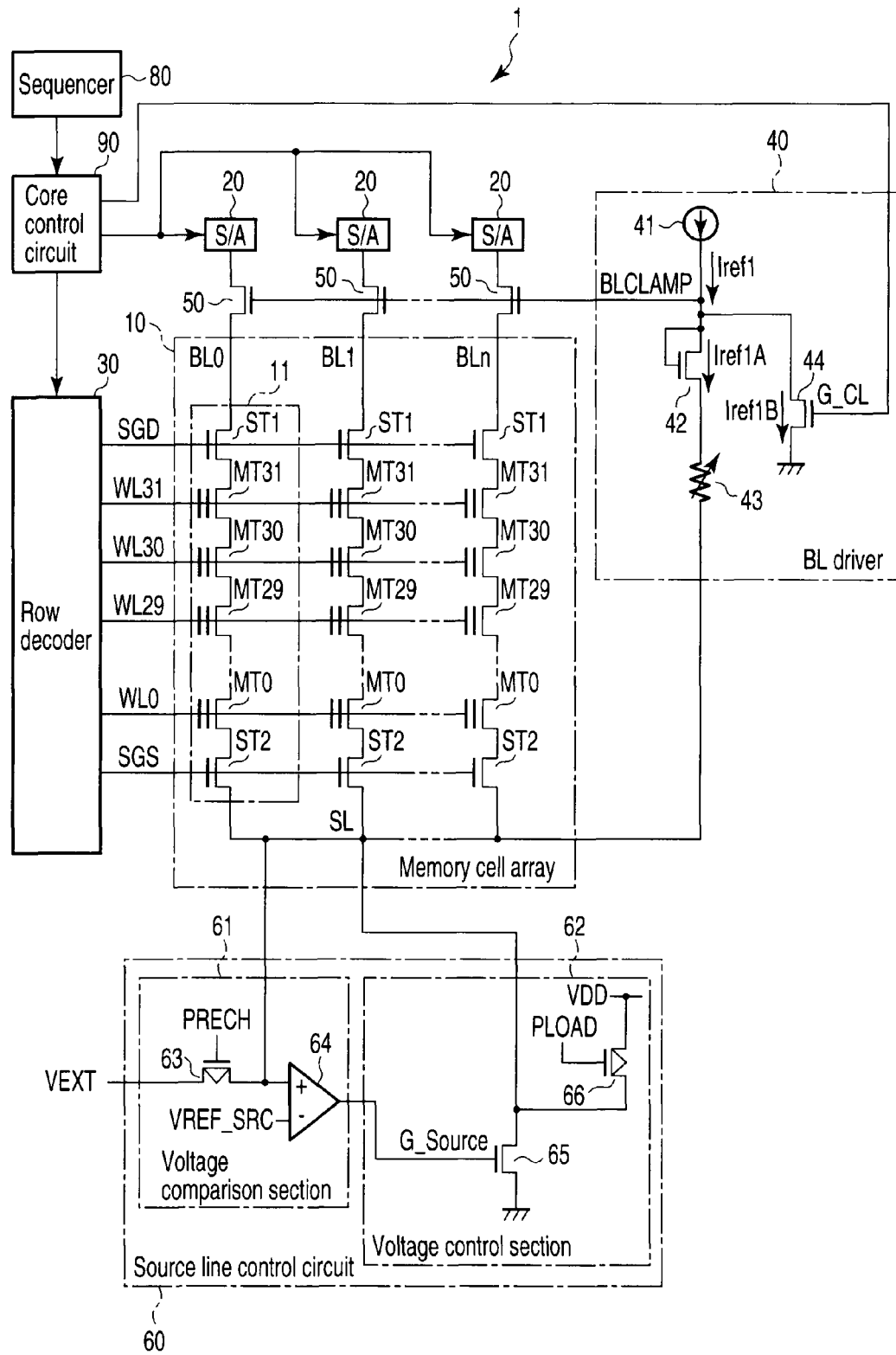
F I G. 2 5

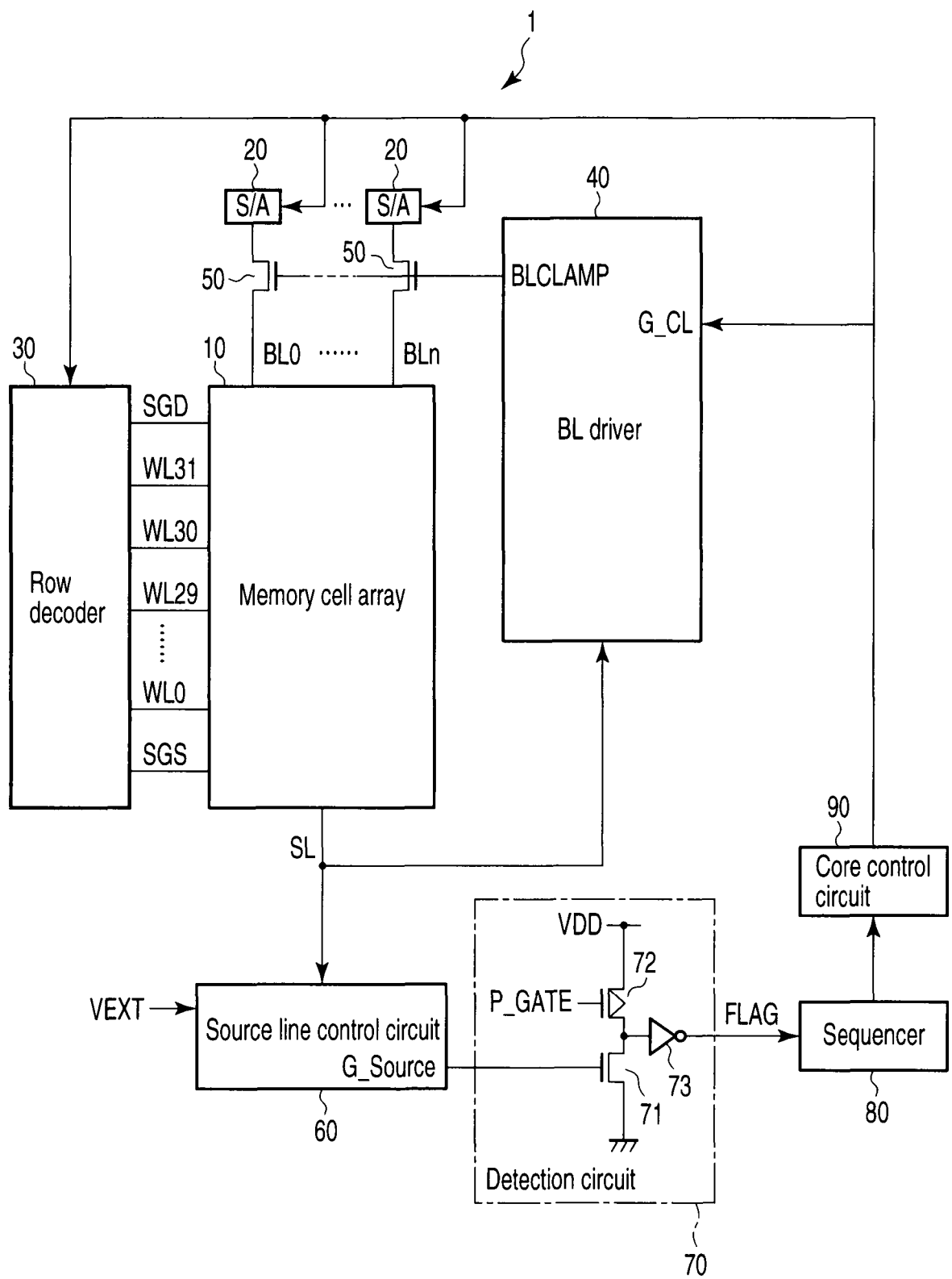
F I G. 29

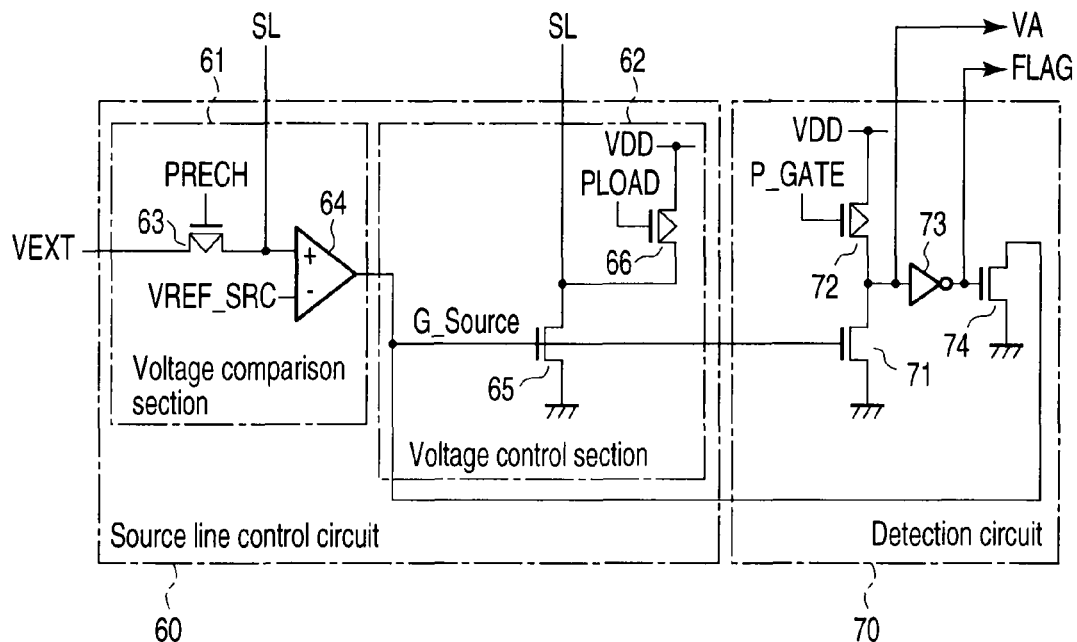
F I G. 3 0
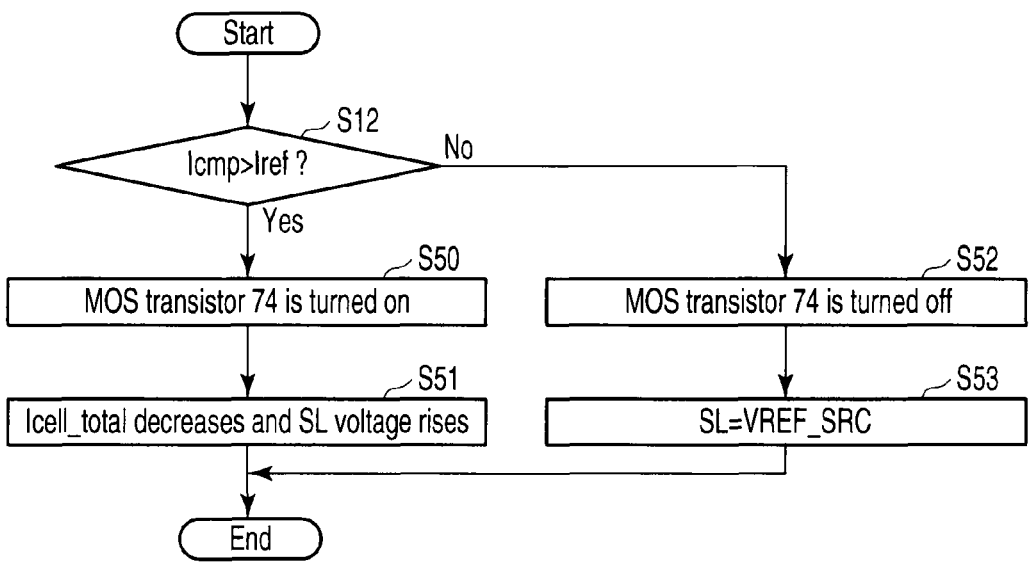
F I G. 3 1

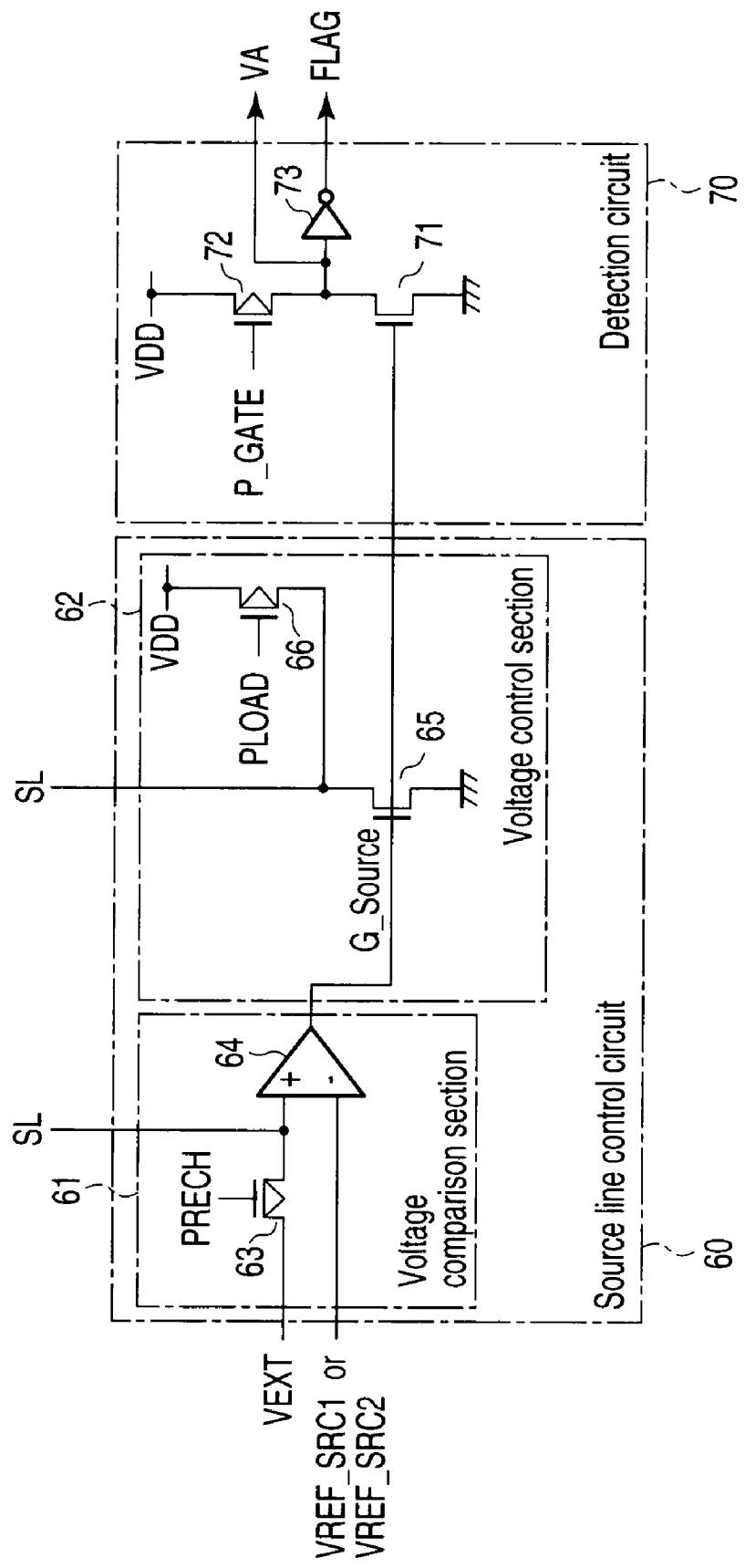
F I G. 34

SEMICONDUCTOR MEMORY DEVICE HAVING STACKED GATE INCLUDING CHARGE ACCUMULATION LAYER AND CONTROL GATE

CROSS-REFERENCE TO RELATED APPLICATIONS

This application is based upon and claims the benefit of priority from prior Japanese Patent Application No. 2008-071580, filed Mar. 19, 2008, the entire contents of which are incorporated herein by reference.

BACKGROUND OF THE INVENTION

1. Field of the Invention

The present invention relates to a semiconductor memory device.

2. Description of the Related Art

NAND flash memories are conventionally known as non-volatile semiconductor memories. For the NAND flash memory, a method of sensing current is known as a data read method. Such a technique is disclosed in, for example, PCT National Publication No. 2006-500727.

This technique maintains the potentials of bit lines constant to reduce adverse effects of noise among the bit lines. However, to maintain the potential of the bit line constant, a cell current needs to flow from the bit line to a source line. Furthermore, according to the method of sensing current, a plurality of sensing operations are performed on the same data on the assumption that the cell current is large.

BRIEF SUMMARY OF THE INVENTION

A semiconductor memory device according to an aspect of the present invention includes:
a memory cell including a charge accumulation layer and a control gate and configured to hold 2 or more levels of data;
a bit line electrically connected to a drain of the memory cell;
a source line electrically connected to a source of the memory cell; and
a detection circuit which detects a current flowing through the source line during a read operation and a verify operation on the data; and
a sense amplifier which reads the data by sensing a current flowing through the bit line during the read operation and the verify operation, whether or not the sense amplifier reads the same data plural times being determined according to a current amount detected by the detection circuit.

BRIEF DESCRIPTION OF THE SEVERAL VIEWS OF THE DRAWING

FIG. 4 is a circuit diagram of a sense amplifier according to the first embodiment;

FIG. 5 is a circuit diagram of a memory cell unit according to the first embodiment;

FIGS. 8 to 11 are circuit diagrams of the sense amplifier according to the first embodiment;

FIGS. 24 and 25 are block diagrams of flash memories according to a third embodiment and a fourth embodiment, respectively;

FIGS. 28 and 29 are block diagrams of flash memories according to a fifth embodiment and a sixth embodiment, respectively;

FIG. 30 is a block diagram of a source line control circuit and a detection circuit according to a seventh embodiment of the present invention;

FIG. 31 is a flowchart showing operation of the flash memory according to the seventh embodiment;

FIG. 34 is a block diagram of a source line control circuit and a detection circuit according to an eighth embodiment of the present invention;

DETAILED DESCRIPTION OF THE INVENTION

First Embodiment

A semiconductor memory device according to a first embodiment of the present invention will be described taking a NAND flash memory by way of example.

<Configuration of the NAND Flash Memory>

Figure 1:
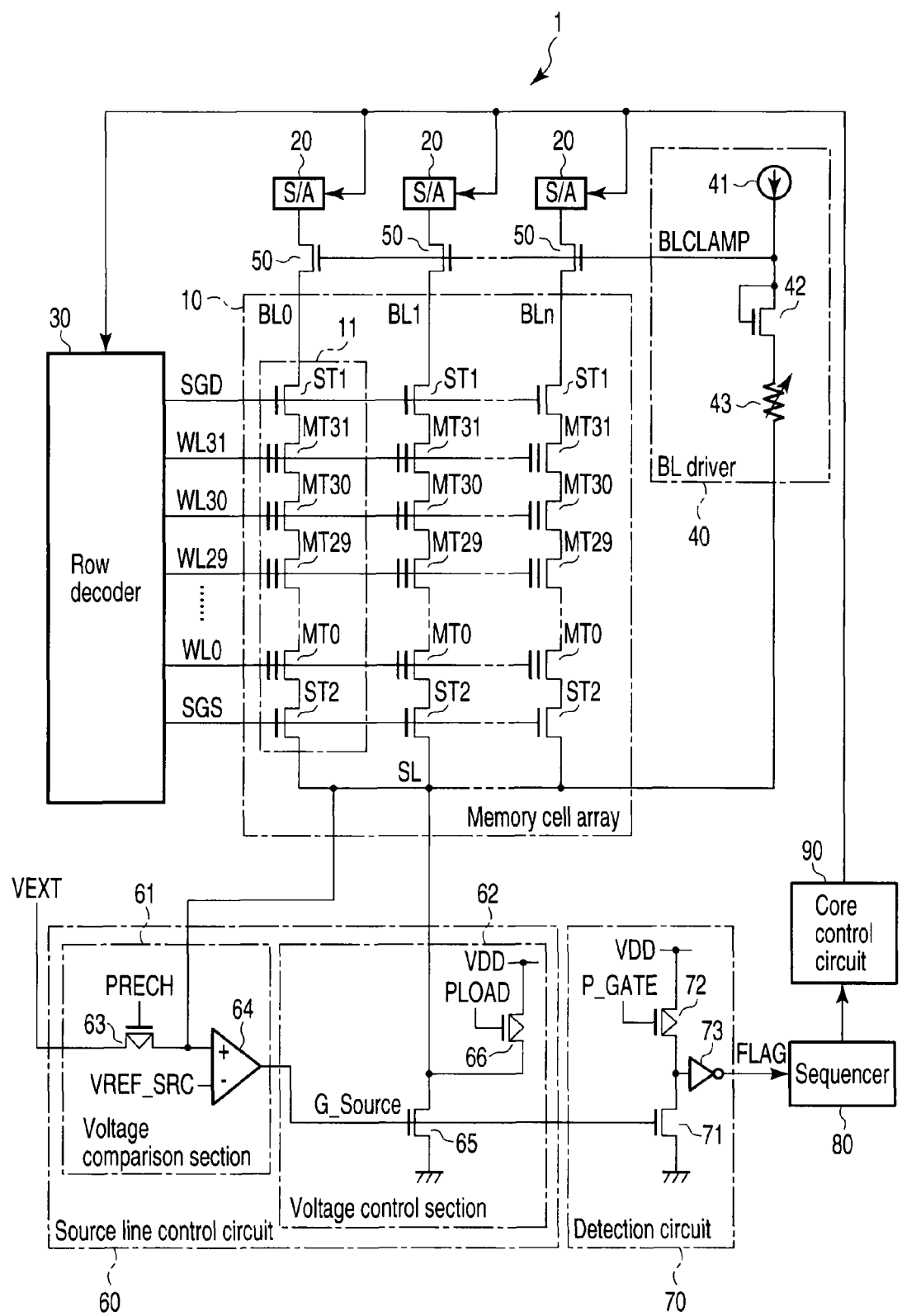
FIG. 1 is a block diagram of a flash memory according to a first embodiment of the present invention.

FIG. 1 is a block diagram of a NAND flash memory according to a first embodiment of the present invention. As shown in FIG. 1, the NAND flash memory 1 includes a memory cell array 10, a sense amplifier 20, a row decoder 30, a bit line driver 40, a MOS transistor 50, a source line control circuit 60, a detection circuit 70, a sequencer 80, and a core control circuit 90.

First, the memory cell array 10 will be described. The memory cell array 10 includes a plurality of memory cell units 11. Each of the memory cell units 11 includes, for example, 32 memory cell transistors MT0 to MT31 and select transistors ST1 and ST2. If the memory cell transistors MT0 to MT31 are not distinguished from one another, the memory cell transistors MT0 to MT31 are collectively referred to as the memory cell transistors MT. The memory cell transistor MT includes a stacked gate structure having a charge accumulation layer (for example, a floating gate) formed on a semiconductor substrate with a gate insulating film interposed therebetween and a control gate formed on the charge accumulation layer with an inter-gate insulating layer interposed therebetween. The number of the memory cell transistors MT is not limited to 32 but may be 8, 16, 64, 128, 256, or the like; no limitation is imposed on the number of the memory cell transistors MT. The adjacent memory cell transistors MT share a source and a drain. The memory cell transistors MT are arranged between the select transistors ST1 and ST2 so that current paths in the memory cell transistors MT are connected together in series. A drain of one of the series-connected memory cell transistors MT which is located at one end of the arrangement of the memory cell transistors MT is connected to a source of the select transistor ST1. A source of one of the series-connected memory cell transistors MT which is located at the other end of the arrangement is connected to a drain of the select transistor ST2.

Control gates of the memory cell transistors MT on the same row are connected commonly to one of word lines WL0 to WL31. Gates of the memory cell select transistors ST1 on the same row are connected commonly to a select gate line SGD. Gates of the memory cell select transistors ST2 on the same row are all connected to a select gate line SGS. For simplification of description, the word lines WL0 to WL31 are sometimes referred to as word lines WL. Furthermore, drains of the select transistor ST1 on the same column in the memory cell array 10 are all connected to one of bit lines BL0 to BLm (m is a natural number). The bit lines BL0 to BLm are also sometimes simply referred to as the bit lines BL. Sources of the select transistors ST2 are all connected to a source line SL. Both select transistors ST1 and ST2 are not required, and one of the select transistors ST1 and ST2 may be omitted provided that the remaining select transistor enables any of the memory units 11 to be selected.

FIG. 1 shows only one memory cell unit 1. However, a plurality of rows of the memory cell units 11 may be provided in the memory cell array 10. In this case, the memory cell units 11 on the same column are connected to the same bit line BL. Furthermore, data is written to the plurality of memory cell transistors MT connected to the same word line WL at a time. This unit is called a page. Data is erased from the plurality of memory cell units 11 on the same row at a time. This unit is called a memory block.

Figure 2:
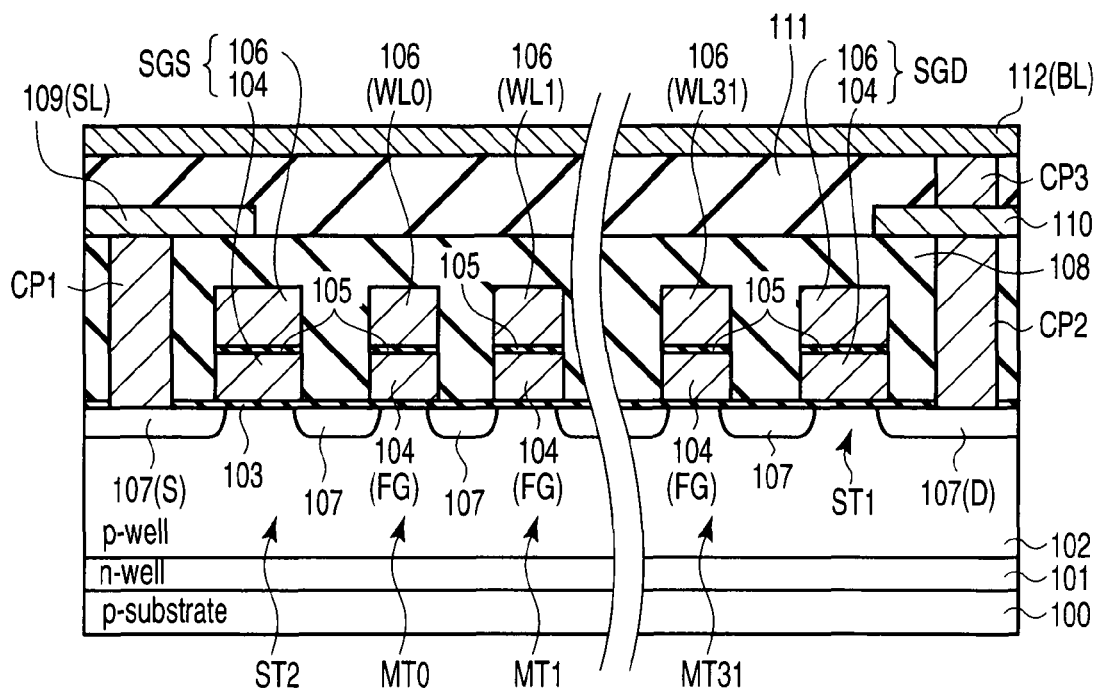
FIG. 2 is a sectional view of a memory cell array according to the first embodiment.

Now, the configuration of the memory cell unit 11, provided in the memory cell array 10, will be described with reference to FIG. 2. FIG. 2 is a sectional view of the memory cell unit 11 taken along a bit line direction of the memory cell unit 11.

As shown in FIG. 2, an n-type well region 101 is formed in a surface region of a p-type semiconductor substrate 100. A p-type well region 102 is formed in a surface region of the n-type well region 101. A gate insulating film 103 is formed on the p-type well region 102. Gate electrodes of the memory cell transistors MT and the select transistors ST1 and ST2 are formed on the gate insulating film 103. The gate electrodes of the memory cell transistors MT and the select transistors ST1 and ST2 each have a polycrystalline silicon layer 103 formed on the gate insulating film 103, an inter-gate insulating film 105 formed on the polycrystalline silicon layer 104, and a polycrystalline silicon layer 106 formed on the inter-gate insulating film 105. The inter-gate insulting film 105 is formed of a silicon oxide film, or an ON film, an NO film, or an ONO film which is a stack structure of a silicon oxide film and a silicon nitride film, or a stack structure including any of the silicon oxide film, the ON film, the NO film, and the ONO film, or a stack structure of a $TiO_2$, $HfO_2$, $Al_2O_3$, $HfAlO_x$, or HfAlSi film, and silicon oxide film or a silicon nitride film. The gate insulating film 103 functions as a tunnel insulating film.

In the memory cell transistor MT, the polycrystalline silicon layer 104 functions as a floating gate (FG). On the other hand, the polycrystalline silicon layers 106 arranged adjacent to each other in a direction orthogonal to the bit lines are connected together and function as a control gate (word line WL). In the select transistors ST1 and ST2, the polycrystalline silicon layers 104 and 106 arranged adjacent to each other in a word line direction are connected together. The polycrystalline silicon layers 104 and 106 thus function as the select gate line SGS or SGD. Alternatively, the polycrystalline silicon layers 104 alone may function as the select gate line. In this case, the potential of the polycrystalline silicon layers 106 in the select transistors ST1 and ST2 are set at a constant value or in a floating state. An $n^+$-type impurity diffusion layer 107 is formed in a surface of the semiconductor substrate 100 between the gate electrodes. The impurity diffusion layer 107 is shared by the adjacent transistors and functions as a source (S) or a drain (D). An area between the source and the adjacent drain functions as a channel region through which electrons migrate. The gate electrode, the impurity diffusion layer 107, and the channel region form a MOS transistor making up the memory cell transistor MT or the select transistor ST1 or ST2.

An interlayer insulating film 108 is formed on the semiconductor substrate 100 so as to cover the memory cell transistors MT and the select transistors ST1 and ST2. A contact plug CP1 is formed in the interlayer insulating film 108 so as to reach the impurity diffusion layer (source) 107 of the source-side select transistor ST2. A metal wiring layer 109 connected to the contact plug CP1 is formed on the interlayer insulating film 108. The metal wiring layer 109 functions as a part of the source line SL. Furthermore, a contact plug CP2 is formed in the interlayer insulating film 108 so as to reach the impurity diffusion layer (drain) 107 of the drain-side select transistor ST1. A metal wiring layer 110 connected to the contact plug CP2 is formed on the interlayer insulating film 108.

An interlayer insulating film 111 is formed on the interlayer insulating film 108 so as to cover the metal wiring layers 109 and 110. A contact plug CP3 is formed in the interlayer insulating film 111 so as to reach the metal wiring layer 110. A metal wiring layer 112 connected to a plurality of the contact plugs CP3 is formed on the interlayer insulating film 111. The metal wiring layer 112 functions as the bit line BL.

Figure 3:
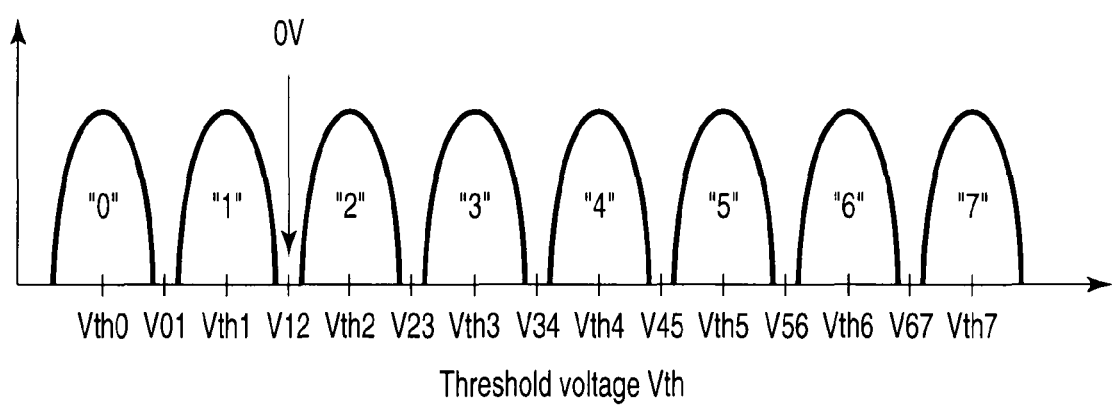
FIG. 3 is a graph showing threshold distributions of a memory cell according to the first embodiment.

Now, threshold distributions of the memory cell transistor will be described with reference to FIG. 3. In FIG. 3, the abscissa axis indicates a threshold voltage Vth. The ordinate axis indicates the presence probability of the memory cell transistor MT.

As shown in FIG. 3, each memory cell transistor MT can hold data of 8 levels (3 bit data). That is, the memory cell transistor MT can hold eight types of data of "0", "1", "2", "3", . . . , "7" in order of increasing threshold voltage Vth. A threshold voltage Vth0 for the "0" data in the memory cell transistor MT is Vth0<V01. A threshold voltage Vth1 for the "1" data is V01<Vth1<V12. A threshold voltage Vth2 for the "2" data is V12<Vth2<V23. A threshold voltage Vth3 for the "3" data is V23<Vth3<V23. A threshold voltage Vth4 for the "4" data is V34<Vth4<V45. A threshold voltage Vth5 for the "5" data is V45<Vth5<V56. A threshold voltage Vth6 for the "6" data is V56<Vth6<V67. A threshold voltage Vth7 for the "7" data is V67<Vth7.

For example, the voltage V12 is 0V. That is, the threshold voltages Vth0 and Vth1 for the "0" data and the "1" data have negative values. The threshold voltages Vth2 to Vth7 for the "2" and "7" data have positive values. A voltage V(i−1)i for "i" data (i is one of 1 to 7) is hereinafter referred to as the "read level" of the "i" data. That is, the voltage V01 is the read level of the "1" data. The voltage V12 is the read level of the "2" data. For the "1" to "7" data, the read level of the "1" data has a negative value, the read level of the "2" data is zero, and the read levels of the data larger than the "2" data have positive values. To read data, the voltage corresponding to the read level is applied to between the gate and source of the memory cell transistor MT.

The read level corresponding to 0V is not limited to V12 but may be the voltage V23 or V34. At least one read level has only to have a negative value. Furthermore, the data that can be held by the memory cell transistor MT is not limited to the 8 levels. For example, the data may be 2 levels (1 bit data), 4 levels (2 bit data), 16 levels (4 bit data), or the like.

Referring back to FIG. 1, a row decoder 30 applies voltages to any of the select gate lines SGD and SGS and the word lines WL during a data write operation, a data read operation, and an erase operation.

For a data write operation, the row decoder 30 applies a voltage to the select gate line SGD to turn on the select transistor ST1. The row decoder 30 applies 0V to the select gate line SGS to turn off the select transistor ST2. Moreover, the row decoder 30 selects any of the word lines WL and applies a program voltage VPGM to the selected word line. The row decoder 30 applies a voltage VPASS to unselected word lines. The program voltage VPGM is a high voltage (for example, 20V) required to inject electrons into the charge accumulation layer. The voltage VPASS turns on the memory cell transistor MT regardless of the data held in the memory cell transistor MT.

For a data erase operation, the row decoder 30 applies 0V to all the word lines WL, and applies a positive voltage (for example, 20V) to the p-type well region 102, in which the memory cell transistor MT is formed. Thus, electrons in the charge accumulation layer 104 are drawn to the well region 102 to erase the data. A data read operation will be described below in detail.

Each of the MOS transistors 50 connects the bit line BL and the sense amplifier 20 together. That is, for each of the MOS transistors 50, one end of the current path is connected to the corresponding bit line BL. The other end of the current path is connected to the corresponding sense amplifier 20. Furthermore, a voltage BLCLAMP is applied to a gate of the MOS transistor 50. Turning on the MOS transistor 50 electrically connects the bit line BL and the sense amplifier 20 together.

The bit line driver 40 applies the voltage BLCLAMP to the gate of the MOS transistor 50. By applying the voltage BLCLAMP to the MOS transistor 50, the bit line driver 40 turns on the MOS transistor 50. As shown in FIG. 1, the bit line driver 40 includes a current source circuit 41, an n-channel MOS transistor 42, and a variable resistance element 43. An output node of the current source circuit 41 is connected to one end of the current path in the MOS transistor 42. In the MOS transistor 42, the one end of the current path is connected to a gate. That is, the MOS transistor 42 functions as a diode element. One end of the resistance element 43 is connected to the other end of the current path in the MOS transistor 42. The other end of the resistance element 43 is connected to the source line SL. The potential of a connection node between the current source circuit 41 and the MOS transistor 42 is provided to the gate of the MOS transistor 50 as a signal BLCLAMP.

Now, the sense amplifier 20 will be described. For the data read operation, each of the sense amplifiers 20 senses and amplifies data read from the memory cell transistor MT onto the bit line BL. For the data write operation, the sense amplifier transfers write data to the corresponding bit line BL. The configuration of the sense amplifier 20 will be described with reference to FIG. 4. FIG. 4 is a circuit diagram of the sense amplifier 20.

As shown in FIG. 4, the sense amplifier 20 includes switch elements 120 to 123, n-channel MOS transistors 124 and 126, a p-channel MOS transistor 127, a capacitor element 128, and a latch circuit 129. One end of a current path in the MOS transistor 124 is connected to a node N_VDD via the switch element 120. The other end of the current path is connected to a node N1. A signal S1 is input to a gate of the MOS transistor 124. The node N1 is connected to the bit line BL via the current path in the MOS transistor 50. One end of a current path in the MOS transistor 126 is connected to the node N1. The other end of the current path is connected to a node N2. A signal S2 is provided to a gate of the MOS transistor 126. The node N2 is connected to the node N_VDD via the switch element 121. One electrode of the capacitor element 128 is connected to the node N2. The other electrode is connected to a node N_VSS. One end of a current path in the MOS transistor 127 is connected to the node N_VDD via the switch element 122. The other end of the current path is connected to the latch circuit 129. A gate of the MOS transistor 127 is connected to the node N2. The switch element 123 connects the bit line BL to the node N_VSS according to the data held in the latch circuit 129.

The node N_VDD functions as a power supply voltage node for the sense amplifier 20 and is provided with, for example, a voltage (VDD+VREF_SRC). A voltage VDD is an internal power source (for example, 1.5V) for the flash memory 1. A voltage VREF_SRC is provided to the source line SL by the source line control circuit 60. The node N_VSS functions as a ground node for the sense amplifier 20 and is provided with, for example, a voltage (VSS+VREF_SRC). The voltage VSS is a ground potential (0V).

Referring back to FIG. 1, the source line control circuit 60 controls the potential of the source line SL. As shown in FIG. 1, roughly speaking, the source line control circuit 60 includes a voltage comparison section 61 and a voltage control section 62.

The voltage comparison section 61 compares the potential of the source line SL with the reference voltage VREF_SRC. The voltage comparison section 61 further provides a voltage to the source line SL. As shown in FIG. 1, the voltage comparison section 61 includes a p-channel MOS transistor 63 and a comparator 64.

A precharge signal PRECH is input to a gate of the MOS transistor 63. An external voltage VEXT is provided to one end of a current path in the MOS transistor 63. The other end of the current path is connected to the source line SL. When the bit line is precharged for the data read operation, the signal PRECH is set to an "L" level to turn on the MOS transistor 63. As a result, the potential of the source line SL is raised.

The comparator 64 has a non-inversion input terminal (+) connected to the source line SL and an inversion input terminal (−) to which the voltage VREF_SRC is input. That is, the comparator 64 compares the potential of the source line SL with the voltage VREF_SRC. The comparator 64 outputs an "H" level when the potential of the source line SL exceeds the voltage VREF_SRC. The value of the voltage VREF_SRC is equal to or larger than the absolute value of the read level V01 of the "0" data, corresponding to the lowest threshold voltage.

Now, the voltage control section 62 will be described. The voltage control section 62 controls the potential of the source line SL based on a comparison result from the comparator 64. As shown in FIG. 1, the voltage control section 62 includes an n-channel MOS transistor 65 and a p-channel MOS transistor 66.

A drain of the MOS transistor 65 is connected to the source line SL. A source of the MOS transistor 65 is grounded. The comparison result from the comparator 64 is provided to a gate of the MOS transistor 65. The gate of the MOS transistor 65, that is, an output node of the comparator 64 is hereinafter referred to as a node G_Source. The gate width of the MOS transistor 65 is hereinafter referred to as a gate width W1.

A signal PLOAD is input to a gate of the MOS transistor 66. A source of the MOS transistor 66 is connected to the power supply potential VDD. A drain of the MOS transistor 66 is connected to the source line SL. During the data read operation, after the potential of the source line SL is raised by the MOS transistor 63, the signal PLOAD is set to the "L" level to turn on the MOS transistor 66. The MOS transistor 66 supplies a voltage to the source line SL to inhibit a possible rapid variation in the potential of the source line SL. The above-described configuration maintains the potential of the source line SL constant at the value VREF_SRC during bit line precharging.

Now, the detection circuit 70 will be described. The detection circuit 70 detects a total cell current of the source line flowing based on the potential of the node G_Source. The detection circuit 70 then determines whether the total value is larger or smaller than the value of the reference current. The detection circuit 70 outputs a determination result in the form of a flag FLAG. As shown in FIG. 1, the detection circuit 70 includes an n-channel MOS transistor 71, a p-channel MOS transistor 72, and an inverter 73.

A gate of the MOS transistor 71 is connected to the node G_Source. A source of the MOS transistor 71 is grounded. That is, the MOS transistor 71 forms a current mirror circuit together with the MOS transistor 65. The gate width of the MOS transistor 71 is hereinafter referred to as a gate width W2. The gate width W2 is smaller than the gate width W1. For example, the ratio W1:W2=10:1. That is, the value of a current flowing through the MOS transistor 71 is smaller than that of a current flowing though the MOS transistor 65 (that is, a current flowing through the source line SL); the former is (W2/W1) times as large as the latter, namely, the former is one-tenth of the latter.

A signal P_GATE is input to the MOS transistor 72. A source of the MOS transistor 72 is connected to the power supply potential VDD. A drain of the MOS transistor 72 is connected to a drain of the MOS transistor 71. The signal P_GATE is provided to the gate of the MOS transistor 72 to allow the MOS transistor 72 to supply current.

The inverter 73 inverts the voltage level of a connection node between the drain of the MOS transistor 71 and the drain of the MOS transistor 72. The inverter 73 outputs the result of the inversion to the sequencer 80 as the flag FLAG.

The sequencer 80 controls the data read operation, data write operation, and data erase operation in the NAND flash memory 1. For example, the read operation sequentially reads the data starting with the "1" data and ending with the "7" data (this is called a read sequence). The write operation is performed by repeating data programming and program verification (this is called a write sequence). The programming is an operation of causing a potential difference between the control gate 106 and channel of the memory cell transistor MT to inject electrons into the charge accumulation layer 104. The program verification is an operation of reading data from the memory cell transistor MT subjected to programming to determine whether or not the threshold voltage of the memory cell transistor MT has a desired value. Furthermore, the erase operation is performed by data erasure and erase verification (this is called an erase sequence). The erase verification is an operation of reading data from the memory cell transistor MT subjected to the erasure to determine whether or not the threshold voltage of the memory cell transistor MT has a desired value. If the program verification and the erase verification are not distinguished from each other below, the two types of operations are collectively called verification. The sequencer 80 instructs a core control circuit 90 to execute the above-described sequences.

The core control circuit 90 controls the operation of the appropriate block of the NAND flash memory 1, for example, the row decoder 30 or the sense amplifier 20, according to the instruction from the sequencer 80 so that the required sequence is executed.

<Data Read Operation>

Now, the data read operation in the NAND flash memory according to the present embodiment will be described below. The description below also applies to the verification. The program verification is the same as the erase verification except for the voltage applied to the word line WL.

<<Voltage Relationship Among the Signal Lines>>

First, the voltage relationship among the signal lines during the read operation will be described with reference to FIG. 5. FIG. 5 is a circuit diagram of the memory cell unit 11 during a data read. In an example described below, the read is performed on the memory cell transistor MT connected to the word line WL1.

First, the sense amplifier 20 (not shown in the drawings) precharges all the bit lines BL via the current path in the MOS transistor 50. The source line control circuit 60 applies the voltage VREF_SRC to the source line SL. The row decoder 30 applies the voltage VREF_SRC to the well region 102.

The row decoder 30 selects the word line WL1 and applies a read voltage VCGR to the selected word line WL1. The row decoder 30 further applies a voltage VREAD to the unselected word lines WL0 and WL2 to WL31. The row decoder 30 further applies the voltage (VDD+VREF_SRC) to the select gate lines SGD and SGS.

The voltage VREAD turns on the memory cell transistor MT regardless of the data held in the memory cell transistor MT. The voltage VCGR is applied to the memory cell transistor to be subjected to the read and varies according to the data to be read. The voltage (VDD+VREF_SRC) applied to the select gate lines SGD and SGS allows the selected transistors ST1 and ST2 to be turned on.

As a result of the above-described operations, the memory cell transistors MT connected to the unselected word lines WL0 and WL2 to WL31 are turned on to form a channel. The selected transistors ST1 and ST2 are also turned on.

When the memory cell transistor MT connected to the selected word line WL1 is turned on, the bit line BL and the source line SL are electrically connected each other. That is, current flows from the bit line BL to the source line SL. On the other hand, when the memory cell transistor MT connected to the selected word line WL1 is turned off, the bit line BL and the source line SL are electrically isolated each other. That is, no current flows from the bit line BL to the source line SL. The above-described operations allow the data to be read through all the bit lines simultaneously.

<<Voltage Relationship Among the Memory Cell Transistors MT>>

Now, the voltage relationship among the memory cell transistors MT will be described with reference to FIG. 6, taking a case where the "1" data is read, by way of example.

Figure 6:
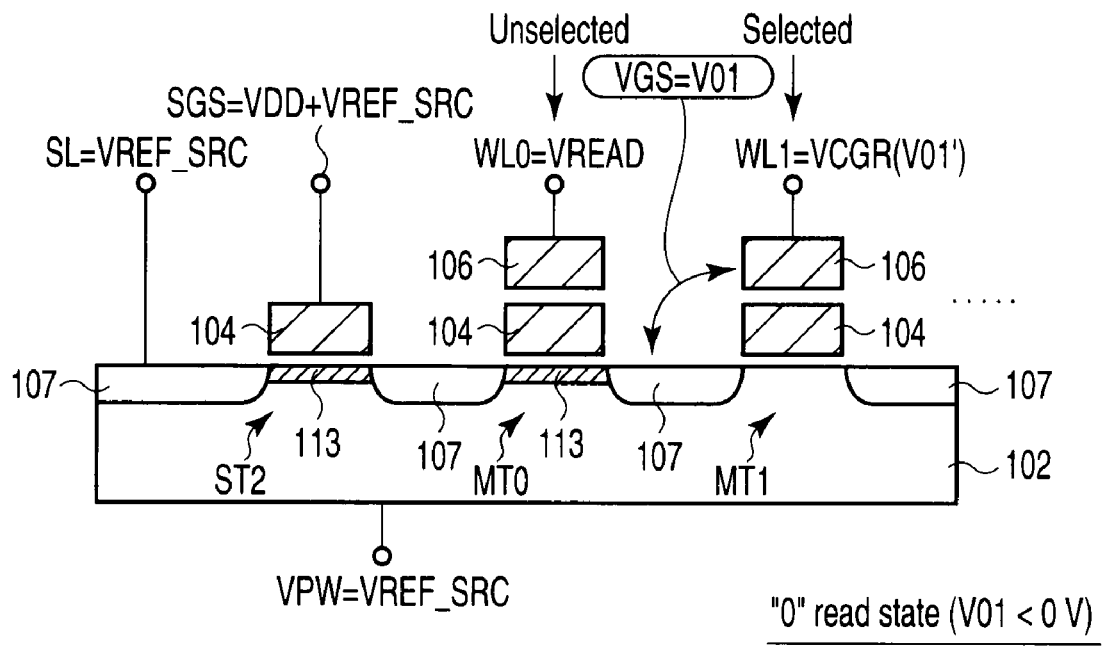
FIG. 6 is a sectional view of a partial region of the memory cell unit according to the first embodiment.

As shown in FIG. 6, the voltage VREF_SRC is applied to the source line SL and the well region 102. The voltage (VDD+VREF_SRC) is applied to the select gate line SGS. The voltage VREAD is applied to the word line WL0. Thus, a channel 113 is formed in the selected transistor ST2 and the memory cell transistor MT0. This also applies to the selected transistor ST1 and the memory cell transistors MT2 to MT31. Then, the voltage VCGR is applied to the selected word line WL1. If the read level is negative, the value of the voltage VCGR is equal to the voltage VREF_SRC minus the absolute value of the read level. That is, if the "1" data is read, the voltage VCGR=V01'=(VREF_SRC−|V01|) and preferably has a value of at least zero. For example, when the voltage VREF_SRC=|V01|, the voltage VCGR=V01'=0V.

Thus, the voltage V01 is applied to the memory cell transistor MT1 as a gate-source voltage VGS. Provided that the memory cell transistor MT1 holds the "1" data, the memory cell transistor MT1 is off, with no cell current flowing through the memory cell transistor MT1. In contrast, when the memory cell transistor MT1 is turned on, this means that the memory cell transistor MT1 holds the "0" data. Thus, with the above-described reading method, reading the "1" data also corresponds to reading the "0" data.

If the read level is zero or positive, the value of the voltage VCGR is equal to the voltage VREF_SRC plus the read level. That is, if the "2" data is read, since V12=0V, the voltage VCGR=V12'=VREF_SRC. If the "3" data is read, the voltage VCGR=V23'=(VREF_SRC+V23).

Figure 7:
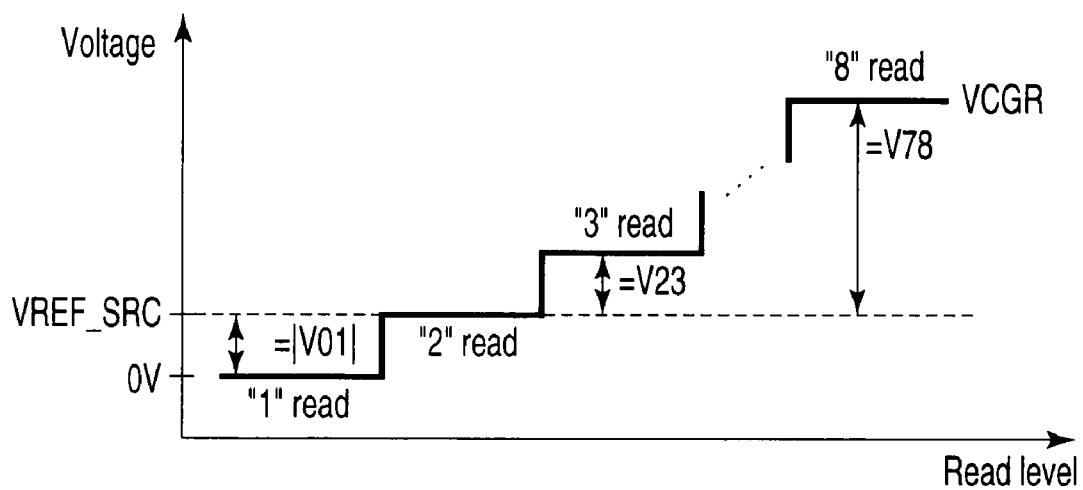
FIG. 7 is a graph showing a relationship between a read level and a word line voltage in the flash memory according to the first embodiment.

FIG. 7 is a graph showing the relationship between the read level and the voltage VCGR. As shown in FIG. 7, to read data of a negative read level, VCGR is set equal to VREF_SRC minus the absolute value of the read level. To read data of a positive read level, VCGR is set equal to VREF_SRC plus the absolute value of the read level. Then, the voltage of the read level can be applied to between the gate and source of the memory cell transistor MT, with the value of VCGR maintained at least 0.

<<Operation of the Sense Amplifier>>

Now, the operation of the sense amplifier 20 during the read operation will be described with reference to FIGS. 8 to 11. FIGS. 8 to 11 are circuit diagrams of the sense amplifier 20. A condition in which the memory cell transistor MT is turned on for the data read operation is hereinafter referred to as "1" read. A condition in which the memory cell transistor MT is turned off for the data read operation is hereinafter referred to as "0" read. During the read operation, the signals S1 and S2 are set to (Vt+0.9V+VREF_SRC) and (Vt+1.2V+VREF_SRC)). The signal BLCLAMP is set to (VTN+0.7V+VREF_SRC). Vt denotes a threshold voltage for the MOS transistors 124 and 126. VTN denotes a threshold voltage for the MOS transistor 50.

(CASE 1)

First, CASE 1 in which "1" read is performed will be described.

Figure 8:
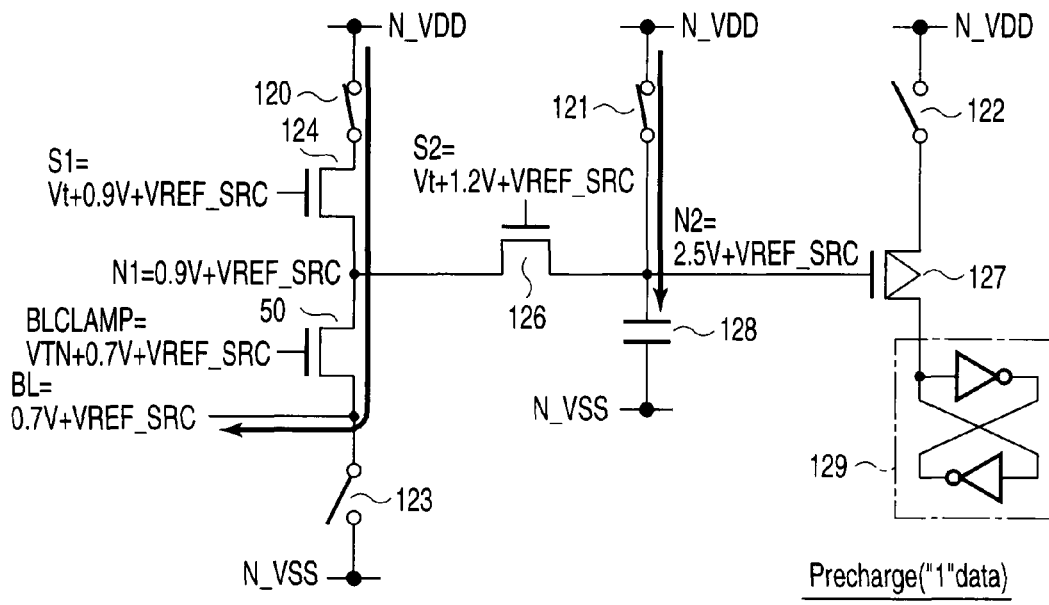

First, as shown in FIG. 8, the bit line BL is precharged. It is assumed below that a precharge level VPRE is 0.7V.

As shown in FIG. 8, the switch element 120 is turned on. Then, since the memory cell unit 11 is electrically conductive, a current flows through the bit line BL via the switch element 120, the current path in the MOS transistor 124, the node N1, and the current path in the MOS transistor 50. As a result, the potential of the bit line BL is set to about (0.7V+VREF_SRC). That is, with the current flowing from the bit line BL to the source line SL, the potential of the bit line BL is fixed to (0.7V+VREF_SRC). Furthermore, since the switch element 121 is turned on, the capacitor element 128 is charged to set the potential of the node N2 to about (2.5V+VREF_SRC). The switch elements 122 and 123 remain off.

Figure 9:
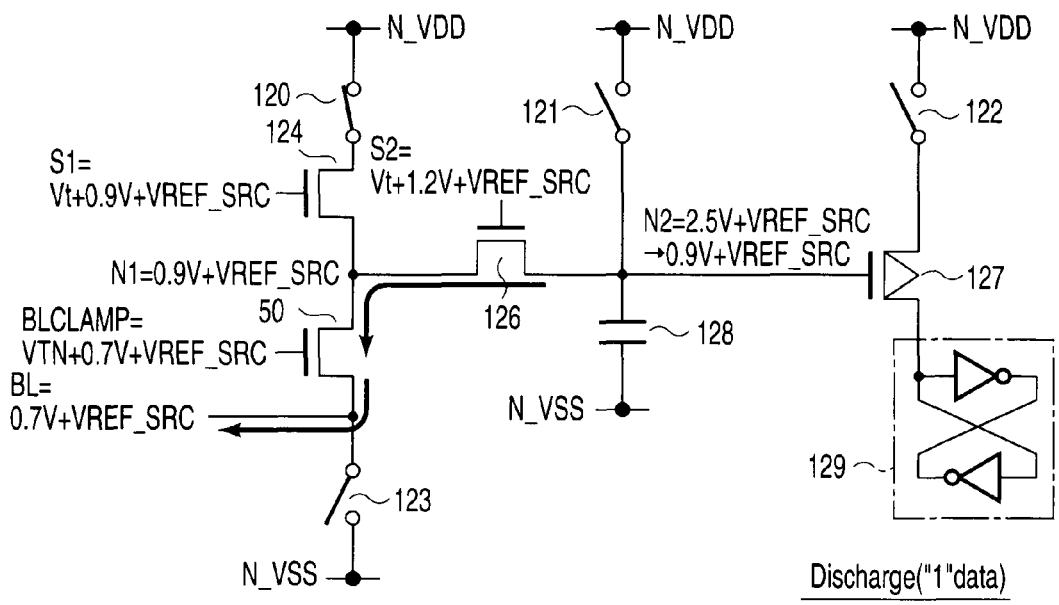

Then, as shown in FIG. 9, the node N2 is discharged. That is, the switch element 121 is turned off. Then, a current flowing from the node N2 to the bit line BL discharges the node N2 to reduce the potential of the node N2 to about (0.9V+VREF_SRC).

Still referring to FIG. 10, the node N2 is discharged. As shown in FIG. 9, when the potential of the node N1 starts to decrease to (0.9V+VREF_SRC) or less, the MOS transistor 124 starts to supply current. As a result, the potential of the node N1 is maintained at (0.9V+VREF_SRC).

Then, as shown in FIG. 11, data sensing is performed. As shown in the figure, the switch element 122 is turned on. Since the potential of the node N2 is at (0.9V+VREF_SRC), the MOS transistor is 57 is turned on. Thus, the latch circuit 129 holds the voltage (VDD+VREF_SRC). Since the latch circuit 129 holds (VDD+VREF_SRC), the switch element 120 is turned off, and the switch element 123 is turned on. Consequently, the potential of the node N2 is set to VREF_SRC. As a result, the latch circuit 129 continues to hold the voltage VDD. Furthermore, a current flows from the bit line BL to the node N_VSS via the switch element 123. The potential of the bit line BL is thus set to VREF_SRC.

That is, the data read operation is performed by the sense amplifier 4 by sensing the current flowing through the bit line BL.

Furthermore, in the present embodiment, every time data is read, the processing from precharging through sensing shown in FIGS. 8 to 11 is carried out once or plural times (for example, twice). When two sensing operations are performed, first, during the first read, data is read from the memory cell transistor MT through which the cell current flows smoothly and then from the memory cell transistor MT through which the cell current fails to flow smoothly. This is to inhibit the adverse effect of noise (variation) in the source line SL. In the second read, the memory cell transistor MT, turned on during the first read, is forcibly turned off. The number of sensing operations is determined by a corresponding instruction from the sequencer 80. This will be described below.

(CASE II)

Now, CASE II in which "0" read is performed will be described.

In this case, no current flows through the bit line BL, the potential of which is then maintained constant at (0.7V+VREF_SRC). The potential of the node N2 is maintained at about (2.5V+VREF_SRC). Thus, the MOS transistor 127 is turned off. The latch circuit 129 holds the voltage VREF_SRC. This turns on the switch element 120 and turns off the switch element 123. The potential of the node N2 is maintained at (2.5V+VREF_SRC). The latch circuit 129 continues to hold the voltage (VREF_SRC).

<<Operations of the Detection Circuit 70 and the Sequencer 80>>

Figure 12:
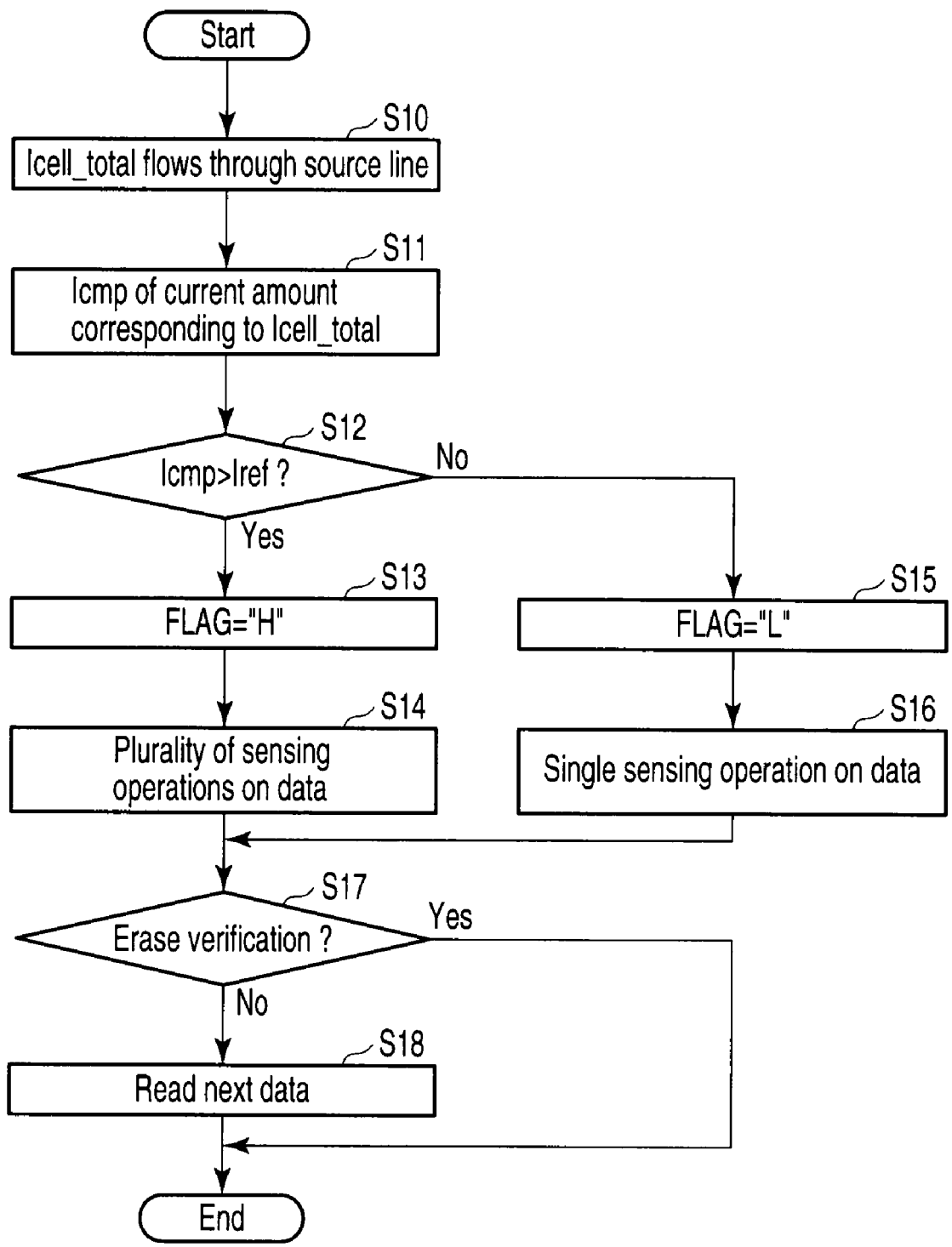
FIG. 12 is a flowchart showing operation of the flash memory according to the first embodiment.
Figure 13:
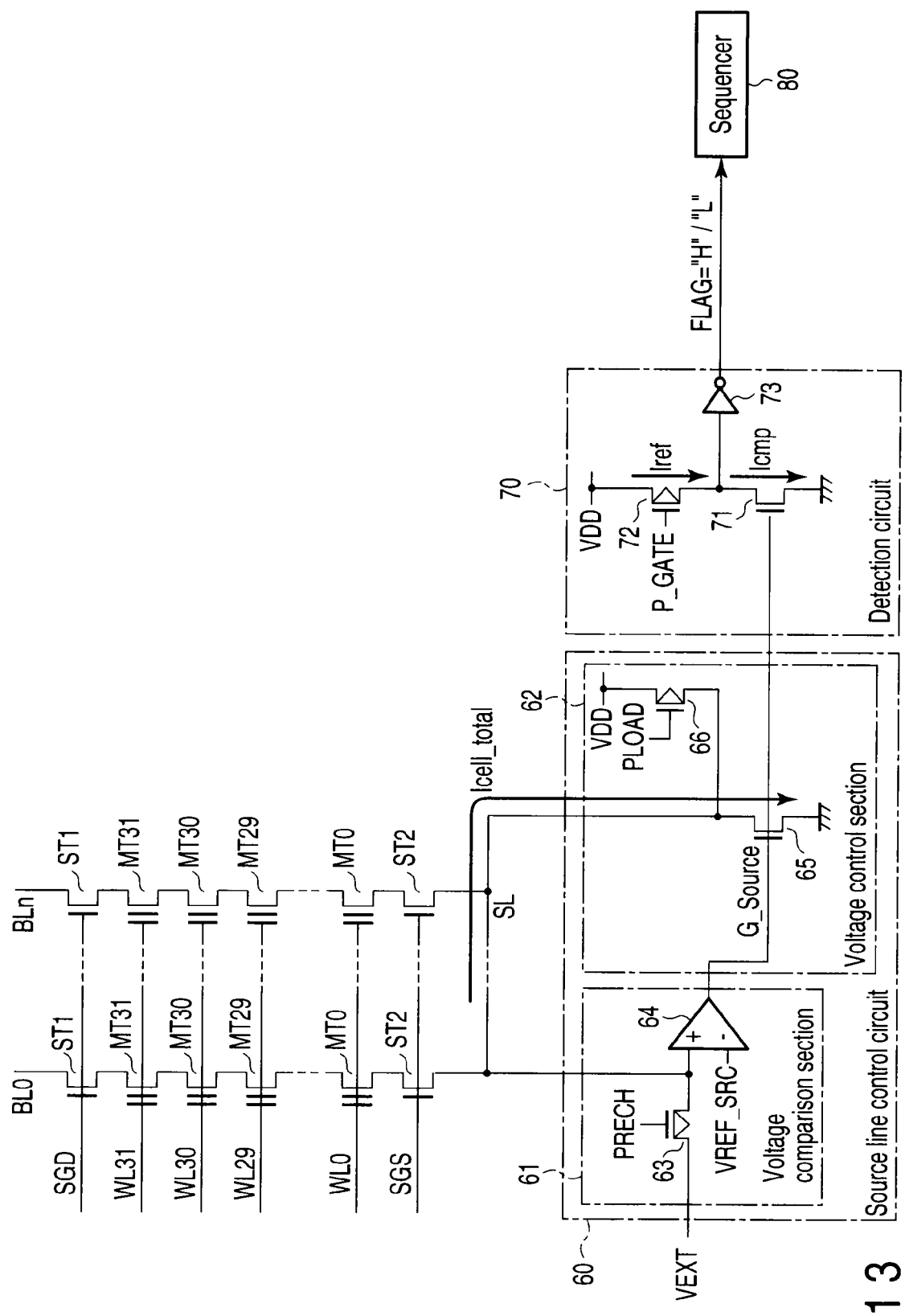
FIG. 13 is a circuit diagram of a partial region of the flash memory according to the first embodiment.

Now, the operations of the detection circuit 70 and sequencer 80 during the read operation will be described with reference to FIGS. 12 and 13. FIG. 12 is a flowchart showing the operations of the detection circuit 70 and sequencer 80 during the read operation. FIG. 13 is a circuit diagram of the memory cell array 10, source line control circuit 60, detection circuit 70, and sequencer 80 during the read operation.

First, the cell current Icell flows from the bit line BL into the source line SL via the memory cell unit 11 (step S10; see FIG. 13). The total cell current Icell is hereinafter referred to as the current Icell_total. The current Icell_total flows into the ground potential via the current path in the MOS transistor 65. The comparator 64 controls the potential of the node G_Source so as to maintain the potential of the source line at VREF_SRC.

In the detection circuit 70, the MOS transistor 71 generates a current Icmp from the current Icell_total (step S11). As described above, the MOS transistor 71 forms a current mirror circuit together with the MOS transistor 65. Thus, the current Icmp=(W2/W1)·Icell_total. The current Icmp flows as a drain current through the MOS transistor 71 (see FIG. 13).

The signal P_GATE is provided to the gate of the MOS transistor 72, which thus generates a reference current Iref (see FIG. 13). That is, the reference current Iref flows as a drain current through the MOS transistor 72. The value of the reference current Iref is (W2/W1) times as large as an allowable upper limit value for the current Icell_total flowing through the source line SL. That is, if the current Icmp is equal to the reference current Iref, the current Icell_total is equal to the allowable upper limit value for the source line. If the current Icmp exceeds the reference current Iref, the current Icell_total exceeds the upper limit value.

If the current Icmp exceeds the reference current Iref (step S12, YES), the input node of the inverter 73 is set to the "L" level. The output node of the inverter 73 is set to the "H" level. Thus, the detection circuit 70 outputs a flag FLAH="H" (step S13). Then, the sequencer 80 determines that the read (precharging and sensing) be performed plural times on the data, and instructs, via the core control circuit 90, the sense amplifier 20 to perform that number of operations (step S14). That is, the operation described with reference to FIGS. 8 to 11 is repeated, for example, twice on the same data.

On the other hand, if the current Icmp does not exceed the reference current Iref2 (step S12, NO) or is equal to the reference current Iref2, the input node of the inverter 73 is set to the "H" level. The output node of the inverter 73 is set to the "L" level. Thus, the detection circuit 70 outputs a flag FLAH="L" (step S15). Then, the sequencer 80 determines that the read (precharging and sensing) be performed once on the data, and instructs, via the core control circuit 90, the sense amplifier 20 to perform the operation once (step S16).

When the data read operation is performed in the erase verification (step S17, YES), the read operation is completed. When the data read operation is not performed in the erase verification (step S17, NO), the sequencer 80 performs the next data read operation.

<<Variation in the Voltage of Each Node During the Read Operation>>

The potential of the bit line BL, the signal BLCLAMP, the potential of the source line SL, the potential of the word line WL, and the total cell current Icell_total during the above-described read operation will be described below in conjunction with a case where Icell_total exceeds the upper limit value and a case where Icell_total does not exceed the upper limit value. The potential of the well region 102 is the same as that of the source line SL.

Figure 14:
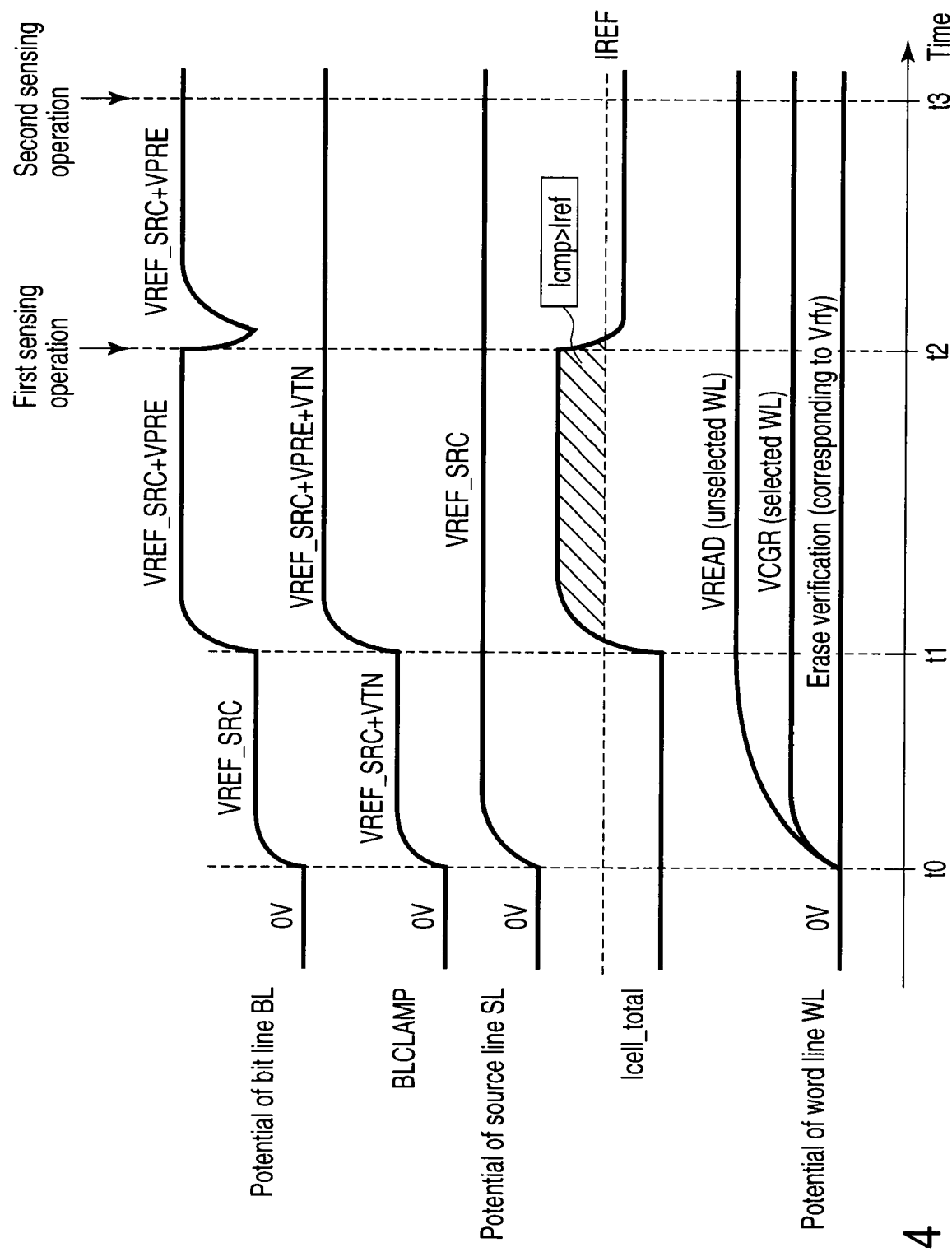
FIGS. 14 and 15 are timing charts of various voltages during a read operation in the flash memory according to the first embodiment.

First, the case where Icell_total exceeds the upper limit value will be described with reference to FIG. 14. FIG. 14 is a timing chart showing variations in various signals during the read.

As shown in FIG. 14, at time t0, the read operation is started. At time t0, the row decoder 30 applies the voltage VCGR to the selected word line WL, while applying the voltage VREAD to the unselected word lines WL. The voltage VCGR has any of the values described with reference to FIG. 7. During the erase verification, a voltage corresponding to a verify level Vrfy is applied.

The bit line driver 40 generates a voltage (VREF_SRC+VTN) as the signal BLCLAMP. As a result, the MOS transistor 50 is turned on. Consequently, the bit line BL and the node N1 are electrically connected together.

The sense amplifier 20 sets the potential of the bit line BL to VREF_SRC. The source line control circuit 60 and the row decoder 30 apply the voltage VREF_SRC to the source line SL and the well region 102, respectively.

Then, at time t1, the sense amplifier 20 performs precharging. Thus, the potential of the signal BLCLAMP is set to (VREF_SRC+VPRE+VTN). The voltage VPRE is a precharge voltage provided by the sense amplifier 20. As a result, the potential of the bit line BL is set to a voltage (VREF_SRC+VPRE). The operation of the sense amplifier 4 in this case is as described with reference to FIG. 8.

Then, the discharging operation described in FIGS. 9 and 10 is performed to allow the cell current to flow from the bit line BL to the source line SL. In this case, it is assumed that the total cell current Icell_total exceeds the upper limit value IREF. That is, it is assumed that Icmp>Iref. This is shown by a shaded area in FIG. 14.

Then, the sequencer 80 determines that the read be performed twice on the data. That is, first, at time t2, the data sensing described with reference to FIG. 11 is performed. Subsequently, the read is performed on the same data. That is, the bit line is precharged and discharged again. At time t3, the second sensing is performed. As described above, during the second read, the bit line connected to the memory cell transistor MT turned on during the first read is not discharged. The potential of the bit line is fixed to VREF_SRC.

Figure 15:
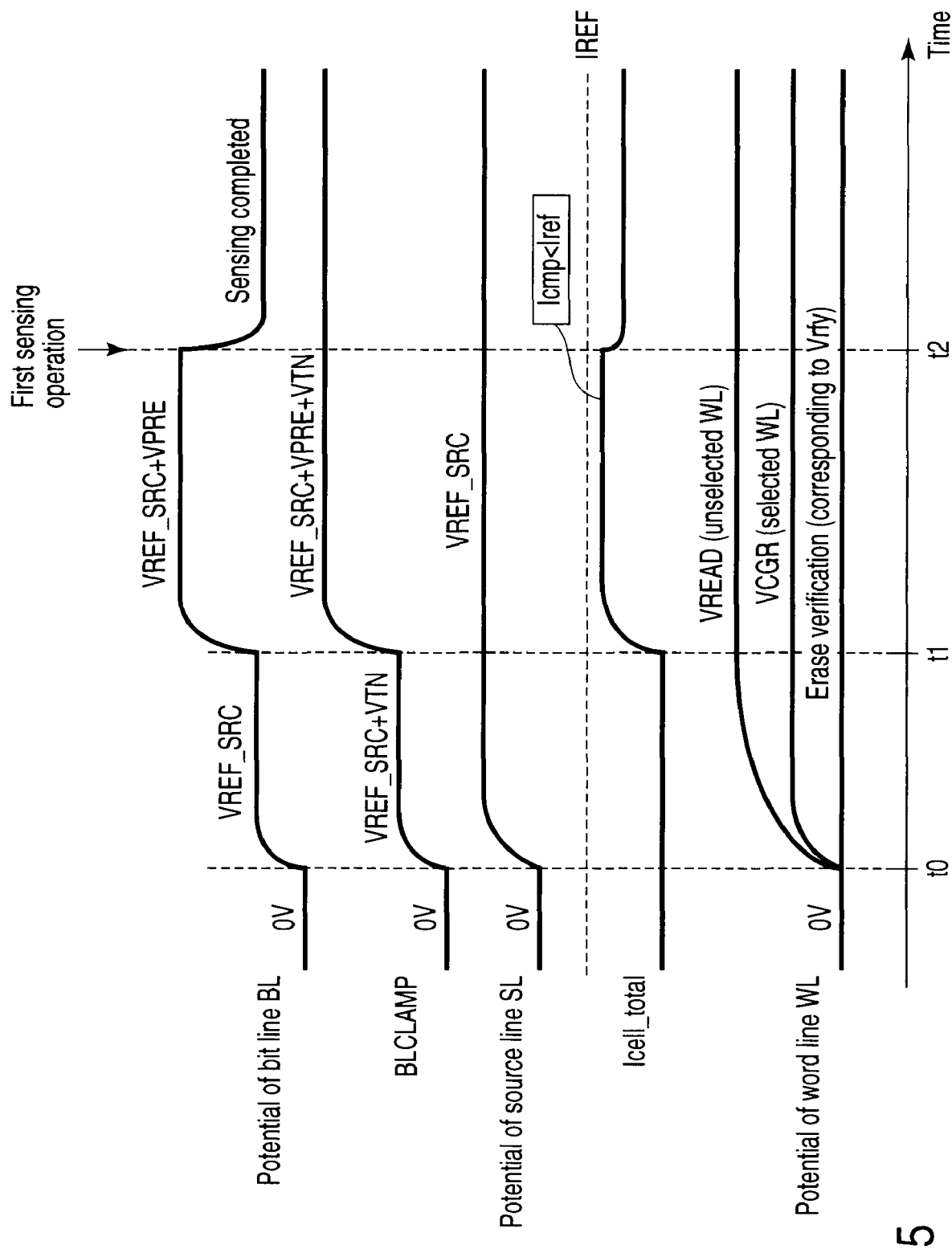

Now, the case in which Icell_total does not exceed the upper limit value IREF will be described with reference to FIG. 15. FIG. 15 is a timing chart showing variations in various signals during the read. Only differences from FIG. 14 will be described.

As shown in FIG. 15, it is assumed that the total cell current Icell_total flowing during the first read is equal to or smaller than the upper limit value IREF. That is, it is assumed that Icmp≦Iref. Then, the sequencer 80 determines that the read be performed once on the data. Thus, at time t2, the data sensing described in FIG. 11 is performed to complete the read of the data. That is, for the erase verification, the corresponding operation is completed at this point in time, and otherwise the read of the next data is started.

<Effects>

As described above, the NAND flash memory according to the first embodiment of the present invention is effective as follows.

(1) The Operation Speed of the NAND Flash Memory can be Improved.

The NAND flash memory according to the present embodiment includes the detection circuit 70, which detects the current flowing through the source line SL during the data read operation and the verify operation. The number of sensing operations on the same data is determined based on a detection result from the detection circuit 70. Thus, the operation speed of the NAND flash memory can be improved. The present effect will be described below in detail.

In this embodiment, the data is read from all the bit lines at a time by sensing a current. With this scheme, each bit line needs to be maintained constant potential in order to eliminate the adverse effect of noise on the adjacent bit line. Thus, during the read, current is allowed to flow continuously through the bit line. Then, the total cell current is very large, for example, about 100 mA. The current flows into the source line to raise the potential of the source line.

Consequently, a plurality of sensing operations are required to prevent the data from being erroneously read. That is, memory cell transistors with larger cell currents are sequentially excluded in order of decreasing cell current. Finally, the results of a sensing operation performed with the rise in the potential of the source line inhibited are loaded into a latch circuit. On the other hand, the total cell current may be small, according to the data pattern. In this case, the potential of the source line is prevented from rising substantially, and erroneous reading is thus unlikely to occur. This eliminates the need for a plurality of sensing operations.

Figure 16:
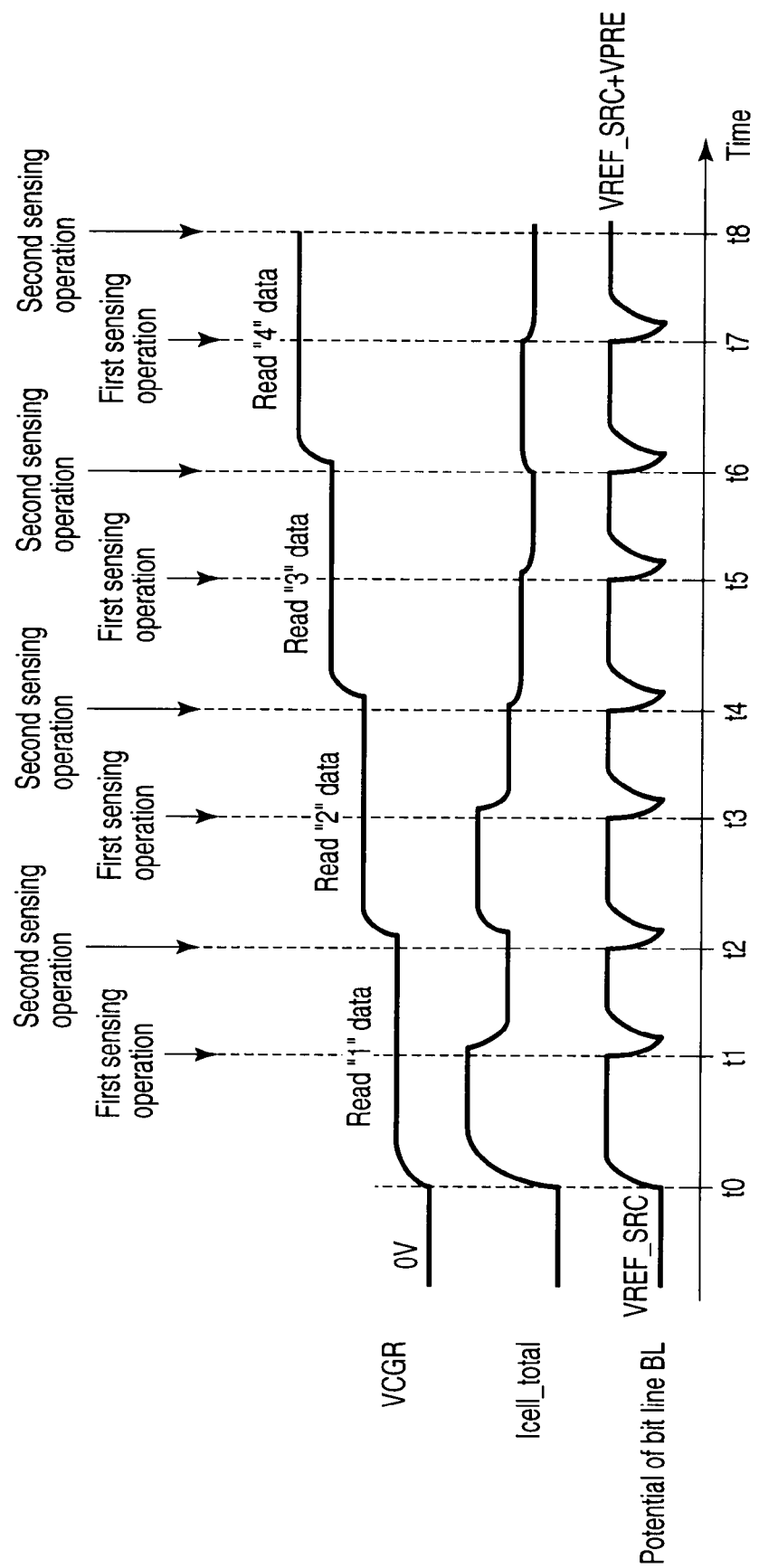
FIG. 16 is a timing chart of various voltages during the read operation in the flash memory according to the first embodiment.

However, the conventional NAND flash memory includes no means for monitoring current. Thus, the read operation needs to be performed with the worst data pattern assumed. As a result, the sensing always needs to be performed plural times. This is shown in FIG. 16. FIG. 16 is a timing chart showing variations in the voltage VCGR, the current Icell_total, and the potential of the bit line BL.

As shown in FIG. 16, the cell current Icell_total increases with decreasing threshold voltage for the data to be read. The cell current Icell_total flowing during the first sensing operation is larger than that flowing during the second sensing operation. Thus, the cell current Icell_total decreases as the data reading operation progresses. That is, even when a large current Icell_total flows during, for example, the first sensing of the "1" data, a sufficiently small current Icell_total may flow during, for example, the sensing operations on the "3" data and subsequent data. Even in this case, the conventional technique performs the sensing twice on all the data, thus reducing the operating speed.

However, in the NAND flash memory 1 according to the present embodiment, the detection circuit 70 detects the cell current Icell_total. The detection circuit 70 then compares the current Icmp of the magnitude corresponding to the cell current Icell_total with the reference current Iref corresponding to the upper limit value IREF. If the current Icmp exceeds the reference current Iref, the sensing is performed plural times (for example, twice; the present invention is not limited to twice) on the same data. If the current Icmp does not exceed the reference current Iref, the sensing is performed once. That is, the sensing is performed plural times for a large cell current Icell_total and once for a small cell current Icell_total. Thus, the sensing operation is performed plural times only when required and otherwise has only to be performed once. Therefore, the speed of the data read operation in the NAND flash memory can be improved.

A specific example will be described with reference to FIG. 17. Like FIG. 16, FIG. 17 is a timing chart showing variations in the voltage VCGR, the current Icell_total, and the potential of the bit line BL observed when the data is sequentially read starting with the "1" data.

Figure 17:
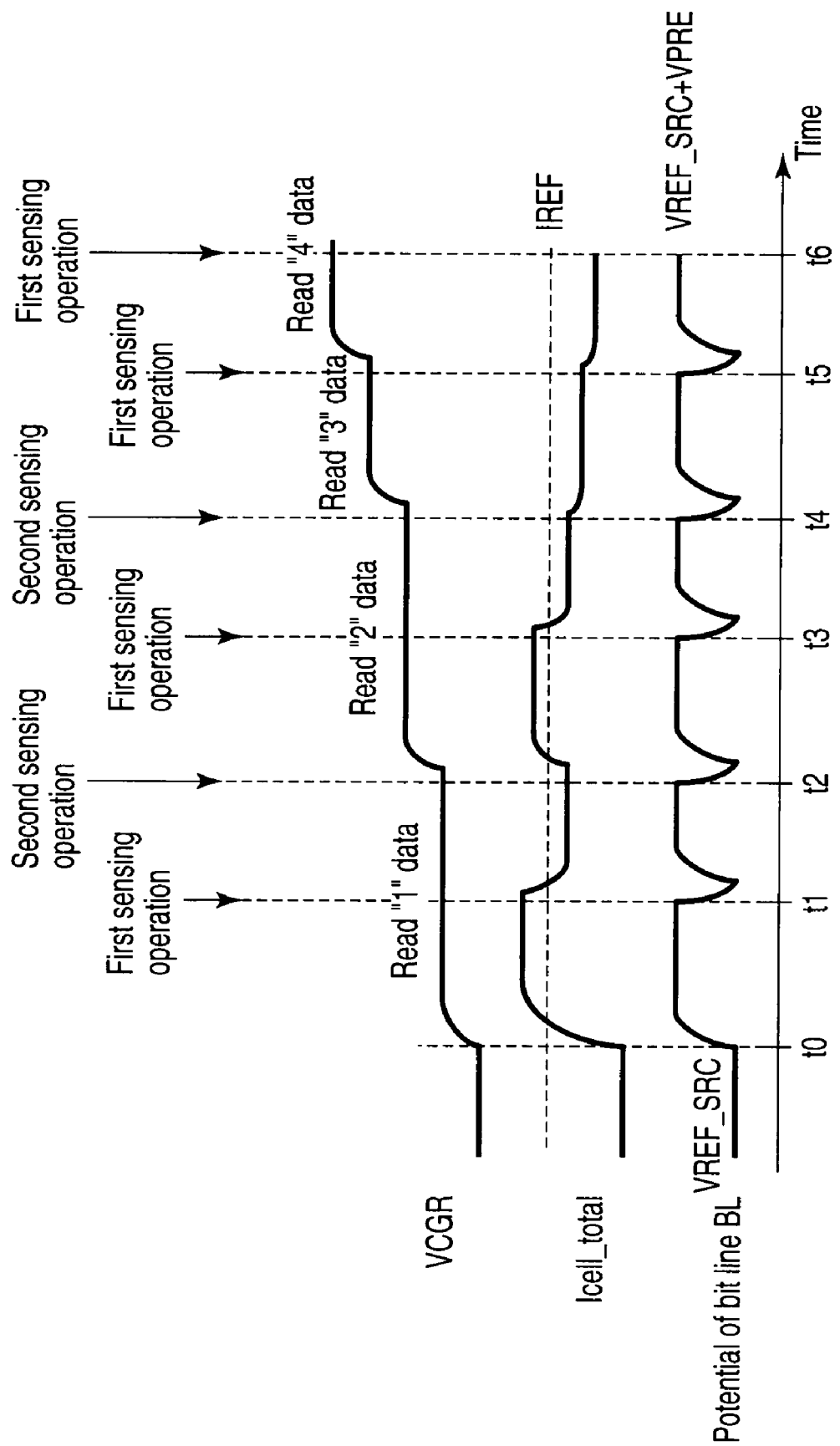
FIG. 17 is a timing chart of various voltages during the read operation in the flash memory according to the first embodiment.

As shown in FIG. 17, during the first sensing, when the "1" data is read, the cell current Icell_total exceeds the upper limit value IREF. Thus, the second sensing is performed on the "1" data. This also applies when the "2" data is read. However, the cell current Icell_total does not exceed the upper limit value IREF during the reading operations on the "3" data and the subsequent data. Thus, the sensing needs to be performed only once on these data. Therefore, the speed of the reading operation can be significantly increased compared to that shown in FIG. 16.

Second Embodiment

Now, a semiconductor memory device according to a second embodiment of the present invention will be described. In the present embodiment, the precharge level of the bit line BL is controlled according to the cell current Icell_total.

<Configuration of the NAND Flash Memory>

Figure 18:
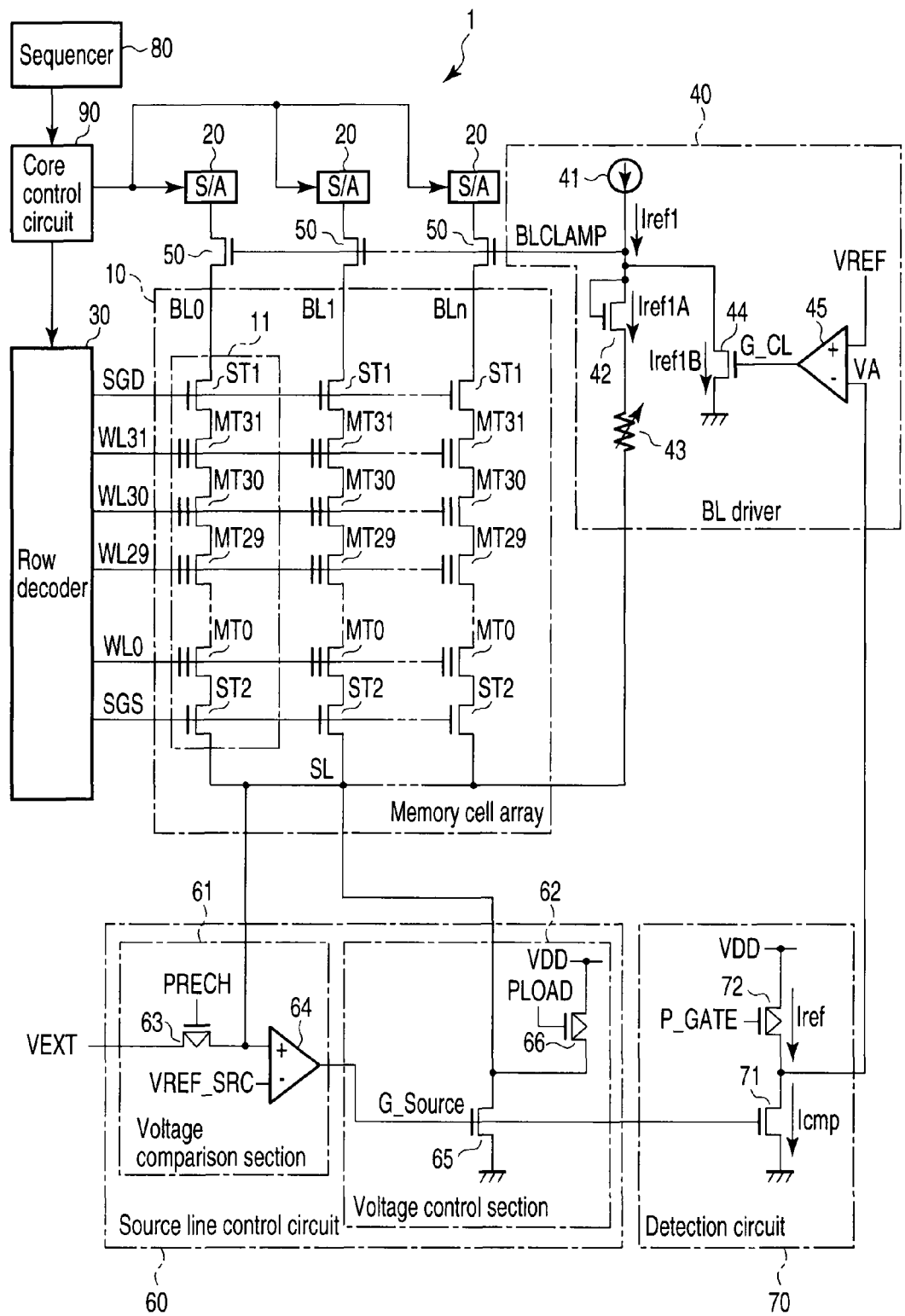
FIG. 18 is a block diagram of a flash memory according to a second embodiment of the present invention.

FIG. 18 is a block diagram of the NAND flash memory according to the second embodiment of the present invention. As shown in FIG. 18, the NAND flash memory 1 includes the memory cell array 10, the sense amplifier 20, the row decoder 30, the bit line driver 40, the MOS transistor 50, the source line control circuit 60, the detection circuit 70, the sequencer 80, and the core control circuit 90, as is the configuration in FIG. 1, described in the first embodiment.

The arrangements of the memory cell array 10, the sense amplifier 20, the row decoder 30, the MOS transistor 50, the source line control circuit 60, and the core control circuit 90 are similar to those in the first embodiment and will thus not be described. Only differences from the first embodiment will be described below.

The detection circuit 70 corresponds to the arrangement in FIG. 1 described in the first embodiment and from which the inverter 73 is omitted. The potential VA of the connection node between the MOS transistors 71 and 72 is supplied to the bit line driver 40.

The sequencer 80 controls the above-described sequence regardless of the detection result from the detection circuit 70. Thus, the sense amplifier 20 performs the sensing plural times on all the data.

The bit line driver 40 corresponds to the arrangement in FIG. 1 described in the first embodiment and further including a MOS transistor 44 and a comparator 45.

The comparator 45 has a non-inversion input terminal (+) to which the reference voltage VREF is provided and an inversion input terminal (−) to which the voltage VA is provided. The comparator 45 compares the reference voltage VREF with the voltage VA to output the result of the comparison as a signal G_CL. The reference voltage VREF corresponds to the upper limit value IREF of the cell current Icell_total. The reference voltage VREF is equal to the voltage VA obtained when Icell_total=IREF.

The signal G_CL is provided to a gate of the MOS transistor 44. A drain of the MOS transistor 44 is connected to the connection node between the MOS transistor 42 and the current source circuit 41. A source of the MOS transistor 44 is grounded (or connected to the source line SL). That is, the potential of the drain of the MOS transistor 44 corresponds to the signal BLCLAMP. A current supplied by the current source circuit 41 is hereinafter referred to as a current Iref1. A drain current from the MOS transistor 42 is hereinafter referred to as a current Iref1A. A drain current from the MOS transistor 44 is hereinafter referred to as a current Iref1B.

<Data Read Operation>

Now, the data read operation in the NAND flash memory according to the present embodiment will be described. The description below also applies to the verification. Only differences from the first embodiment will be described below.

The voltages of the signal lines, the voltage of the memory cell transistors, and the operation of the sense amplifier 20 are similar to those shown in FIGS. 5 to 11, described in the first embodiment. As described above, the sequencer 80 controls the above-described sequence regardless of the detection result from the detection circuit 70.

<<Operation of the Bit Line Driver 40>>

Figure 19:
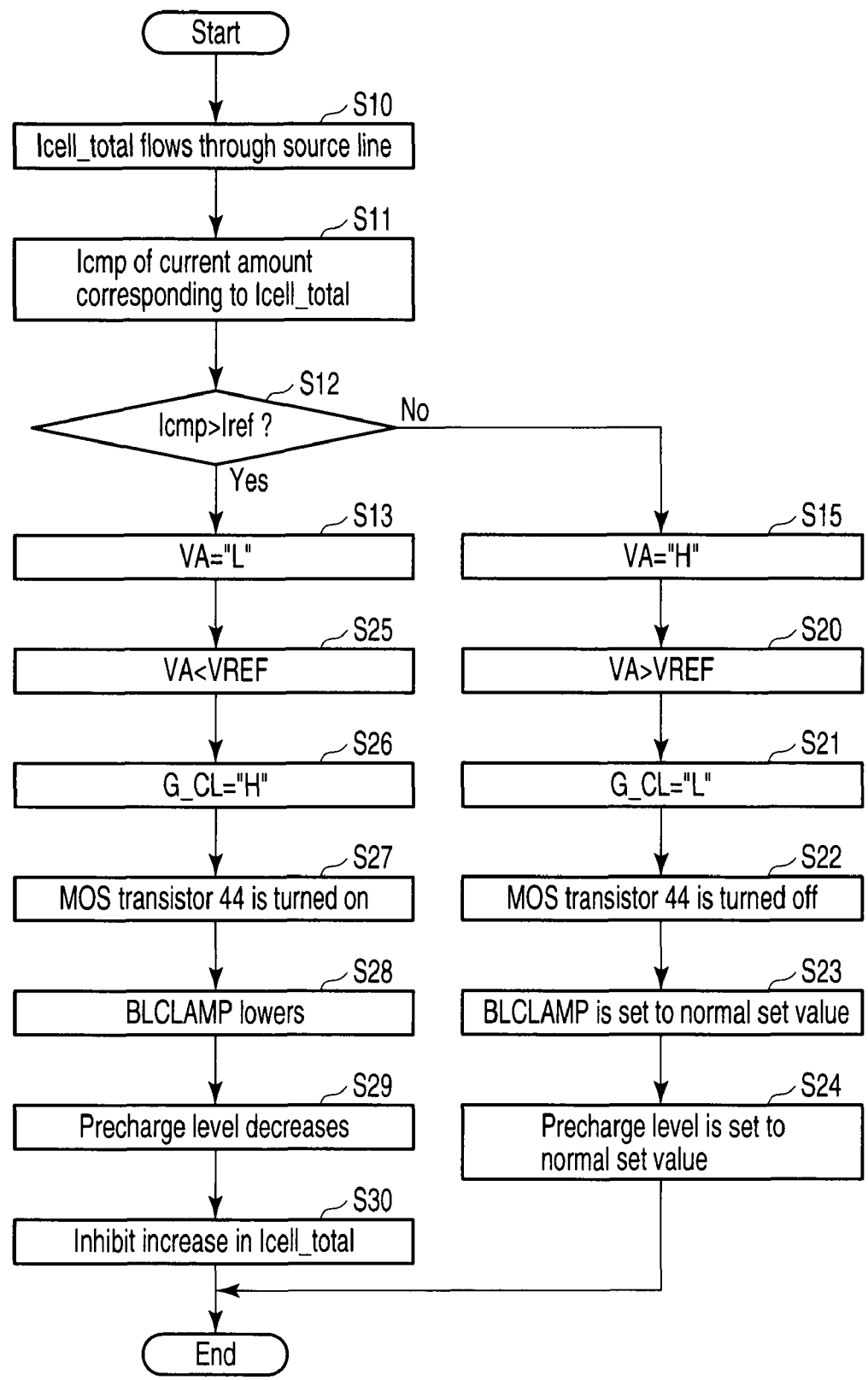
FIG. 19 is a flowchart showing operation of the flash memory according to the second embodiment.

First, the operation of the bit line driver 40 during the read operation will be described with reference to FIGS. 18 and 19. FIG. 19 is a flowchart showing the operation of the bit line driver 40 during the read operation.

After steps S10 and S11, if the current Icmp does not exceed the reference current Iref (step S12, NO), the voltage VA is logically set to the "H" level. That is, VA>VREF (step S20). Thus, the comparator 45 outputs a signal G_CL="L" (step S21). Consequently, the MOS transistor 44 is turned off (step S22) to prevent the current Iref1B from flowing. As a result, the potential of BLCLAMP is determined by the current Iref1A flowing through the MOS transistor 42 and the resistance value of the resistance element 43. That is, the potential of BLCLAMP exhibits a normal set value (step S23). Namely, as is the case with the first embodiment, BLCLAMP=VREF_SRC+VTN+VPRE. As a result, the precharge level of the bit line BL exhibits a normal set value (step S24). That is, as is the case with the first embodiment, the potential of the bit line BL is set to (VREF_SRC+VPRE).

On the other hand, if the current Icmp exceeds the reference current Iref (step S12, YES), the voltage VA is logically set to the "L" level. That is, VA<VREF (step S25). Thus, the comparator 45 outputs a signal G_CL="H" (step S26). Consequently, the MOS transistor 44 is turned on (step S27) to allow the current Iref1B to flow. As a result of the flow of the current Iref1B, the potential of BLCLAMP lowers to a value smaller than that obtained in step S23 (step S28). Thus, a current driving capability of the MOS transistor 50 is degraded to reduce the precharge level of the bit line BL (step S29). As a result, the cell current Icell_total is inhibited from increasing and becomes lower than the upper limit value IREF (step S30).

<<Variation in the Voltage of Each Node During the Read Operation>>

Figure 20:
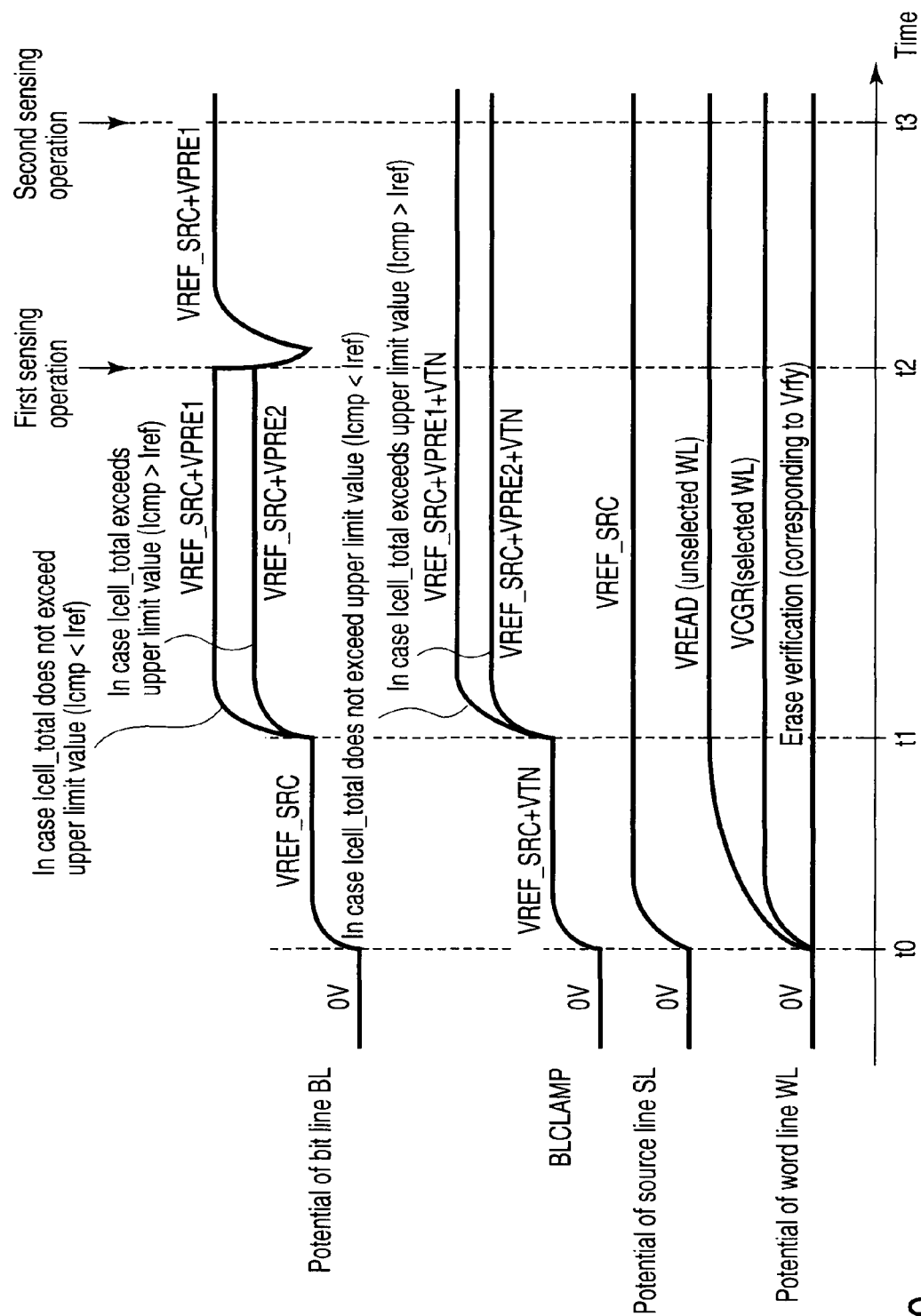
FIG. 20 is a timing chart of various voltages during the read operation in the flash memory according to the second embodiment.

The voltages of the bit line BL, the signal BLCLAMP, the source line SL, and the word line WL during the above-described read operation will be described with reference to FIG. 20. FIG. 20 is a timing chart showing variations in various signals during the read. The potential of the well region 102 is the same as that of the source line SL.

As shown in FIG. 20, the processing from the beginning until time t1 is similar to that in FIG. 4, described in the first embodiment. At time t1, the sense amplifier 20 performs precharging. At this time, the bit line driver 40 determines the precharge level according to the cell current Icell_total. That is, when the cell current Icell_total does not exceed the upper limit value IREF, the MOS transistor 44 is turned off to set BLCLAMP=(VREF_SRC+VTN+VPRE1). As a result, the potential of the bit line BL is set to (VREF_SRC+VPRE1).

On the other hand, when the cell current Icell_total exceeds the upper limit value IREF, the MOS transistor 44 is turned on to set BLCLAMP=(VREF_SRC+VTN+VPRE2). However, VPRE2<VPRE1. As a result, the potential of the bit line BL is set to (VREF_SRC+VPRE2). The operation of the sense amplifier 20 in this case is as shown in FIG. 8. Thereafter, the discharging operation described with reference to FIGS. 9 and 10 is performed. At time t2, the data sensing described with reference to FIG. 11 is performed.

Thereafter, the read is performed on the same data again. That is, the bit line is precharged and discharged again. At time t3, the second sensing is performed. Although not shown in the drawings, if the cell current Icell_total exceeds the upper limit value IREF even during the second read, the potential of the bit line BL is set to (VREF_SRC+VPRE2).

The current Iref1 supplied by the current source circuit 41 has a relationship Iref1=(Iref1A+Iref1B) and is constant. When the resistance value of the resistance element 43 is defined as Rv, BLCLAMP=(Iref1A·Rv+VTN+VREF_SRC) and VPRE=Iref1A·Rv. Thus, VPRE1 in FIG. 20 corresponds to VPRE obtained when the current Iref1B is prevented from flowing, that is, (Iref1·Rv+VREF_SRC). This also applies to the first embodiment. On the other hand, VPRE2 corresponds to VPRE obtained when the current Iref1B flows, that is, ((Iref1−Iref1B)·Rv+VREF_SRC). Thus, obviously, VPRE2<VPRE1.

<Effects>

As described above, the semiconductor memory device according to the second embodiment of the present invention is effective as follows.

(2) The Operational Reliability of the NAND Flash Memory can be Improved (Part 1).

The NAND flash memory according to the present embodiment includes the detection circuit 70, which detects the current flowing through the source line SL during the data read operation and the verify operation. The precharge level of the bit line BL is determined based on the detection result from the detection circuit 70. More specifically, the precharge level is controlled so as to prevent Icell_total from exceeding the upper limit value. Thus, the reliability of the NAND flash memory can be improved. The present effect will be described below.

Figure 21:
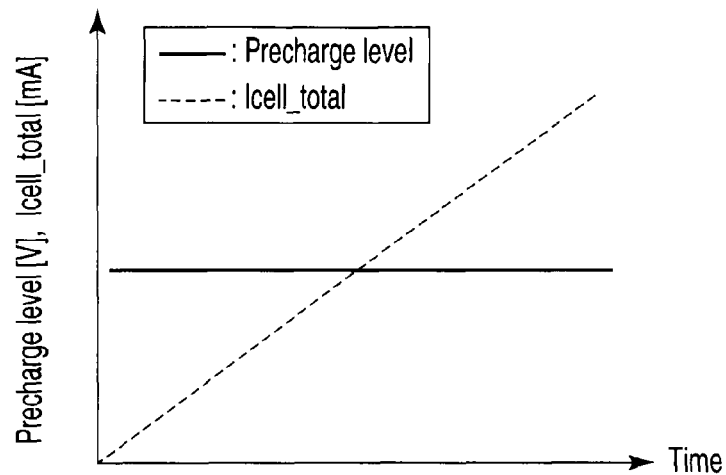
FIG. 21 is a graph showing a relationship between a precharge level and a total cell current.

FIG. 21 is a graph showing variation in the precharge level of the bit line and in the current Icell_total observed when the control of the bit line driver 40 based on the detection result from the detection circuit 70 is avoided. The graph shows that the current Icell_total increases.

As shown in FIG. 21, if the bit line driver 40 is not controlled, the potential of the bit line BL is fixed to a given value regardless of the current Icell_total. That is, the current Icell_total, which is not controlled, may exceed the upper limit value depending on the read data.

Figure 22:
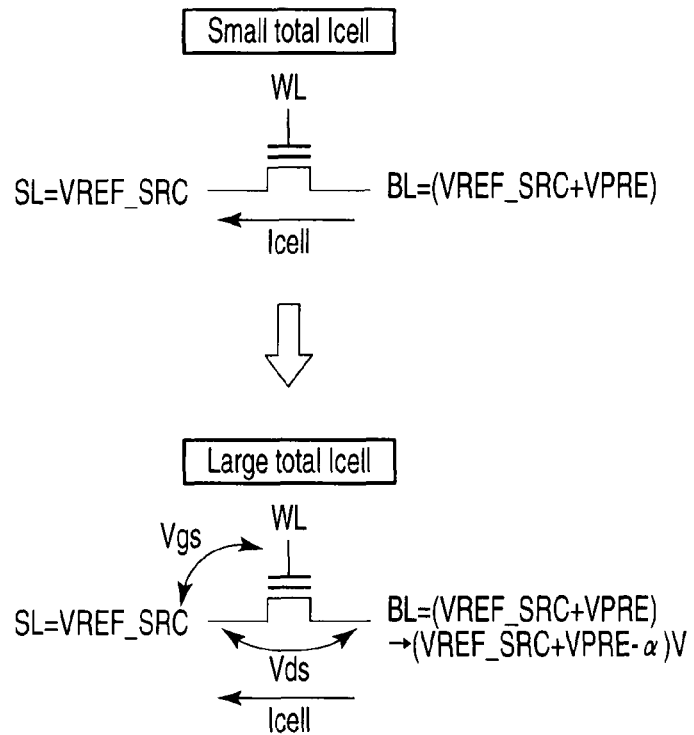
FIG. 22 is a circuit diagram of a memory cell transistor according to a second embodiment, showing a voltage relationship during the read operation.

However, the present embodiment controls the potential of the bit line BL to enable an excessive increase in the current Icell_total in the source line SL to be inhibited. The reliability of the NAND flash memory can thus be improved. This will be described first with reference to FIG. 22. FIG. 22 is a circuit diagram showing the voltage relationship of the memory cell transistor MT according to the present embodiment.

As shown in FIG. 22, if the current Icell_total is small, the potential of the source line SL is set to VREF_SRC. The potential of the bit line BL is set to (VREF_SRC+VPRE). In this case, the gate-source voltage Vgs of the memory cell transistor MT is almost equal to the read level.

On the other hand, when the current Icell_total increases, the bit line driver 40 reduces BLCLAMP. That is, the potential of the bit line BL decreases from (VREF_SRC+VPRE) to (VREF_SRC+VPRE−α). The decrease α corresponds to (Iref−Iref1B)·Rv. Thus, Vgs and Vds are suppressed in compared with the case that the current Icell_total is small. Thus, current Icell_total is prevented from exceeding the upper limit value.

Figure 23:
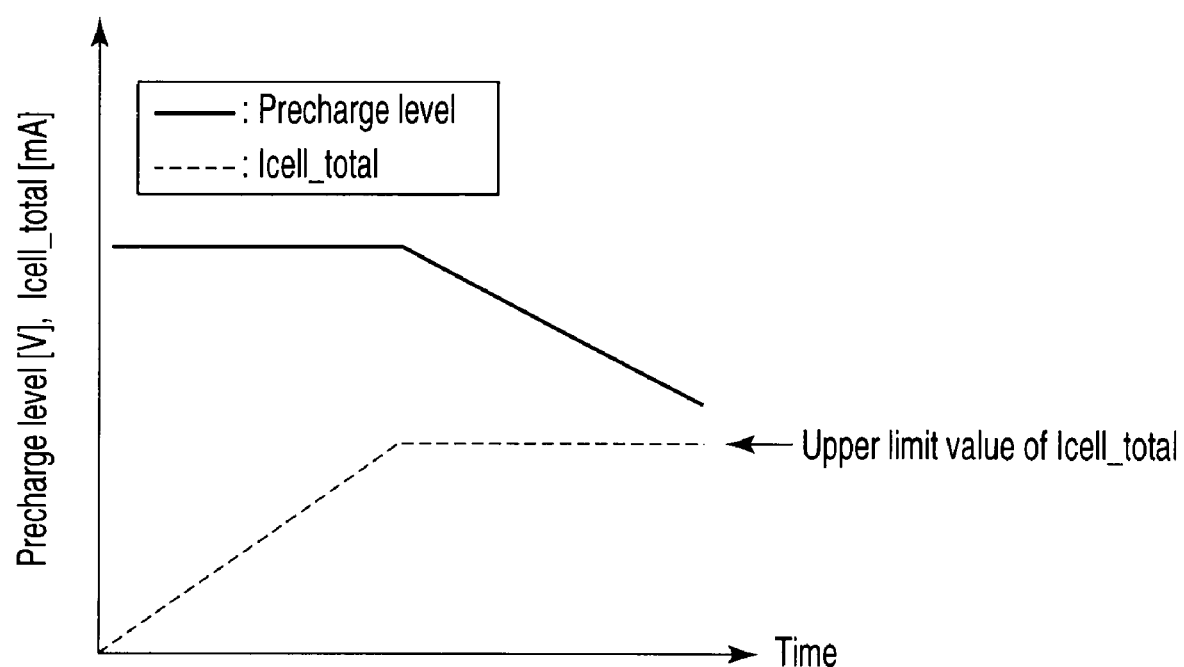
FIG. 23 is a graph showing the relationship between the precharge level and the total cell current in the flash memory according to the second embodiment.

FIG. 23 shows the relationship between the precharge level of the bit line and the current Icell_total according to the present embodiment. Like FIG. 21, FIG. 23 shows that the current Icell_total increases. As shown in FIG. 23, according to the present embodiment, once the current Icell_total reaches the upper limit value, the precharge level of the bit line BL starts to decrease. A further increase in current Icell_total is inhibited.

Third Embodiment

Now, a semiconductor memory device according to a third embodiment of the present invention will be described. The present embodiment corresponds to the above-described second embodiment in which the voltage VREF is generated by a technique different from that according to the second embodiment. Only differences from the second embodiment will be described below.

FIG. 24 is a block diagram of the NAND flash memory 1 according to the present embodiment. The NAND flash memory 1 according to the present embodiment corresponds to the configuration in FIG. 18 described in the second embodiment and in which the detection circuit 70 and the bit line driver 40 are improved.

The detection circuit 70 corresponds to the arrangement shown in FIG. 18 and in which the gate of the MOS transistor 72 is connected to the drain of the MOS transistor 71. Furthermore, the potential of the connection node between the drain of the MOS transistor 72 and the drain of the MOS transistor 71 is supplied to the bit line driver 40 as the voltage VA.

The bit line driver 40 corresponds to the arrangement shown in FIG. 18 and which further includes an n-channel MOS transistor 46 and a p-channel MOS transistor 47. A source of the MOS transistor 46 is grounded. A signal N_GATE is provided to a gate of the MOS transistor 46.

A gate of the MOS transistor 47 is connected to the gate of the MOS transistor 72. A source of the MOS transistor 47 is connected to the power supply voltage VDD. A drain of the MOS transistor 47 is connected to a drain of the MOS transistor 46. That is, the MOS transistor 47 forms a current mirror circuit together with the MOS transistor 72. Thus, the current Iref2 flowing through the MOS transistor 47 corresponds to Iref. Namely, when the MOS transistors 47 and 72 have the same gate width, Iref=Iref2. When the MOS transistors 47 and 72 have different gate widths, Iref and Iref2 have values corresponding to the ratio of the gate widths. The potential of a connection node between the drain of the MOS transistor 46 and the drain of the MOS transistor 47 is input to the non-inversion input terminal (+) of the comparator 45 as the voltage VB. The voltage VB corresponds to the reference voltage VREF, described in the second embodiment.

The comparator 45 compares the voltage VA with the voltage VB. That is, if VB≧VA, the comparator 45 outputs the signal G_CL="H". If VB<VA, the comparator 45 outputs the signal G_CL="L".

In the above-described configuration, the signal N_GATE is set to such a value as sets the voltage VB equal to the voltage VA obtained when Icell_total=IREF (that is, Icmp=Iref).

Even with the above-described configuration, when Icell_total exceeds IREF, the signal G_CL is set to the "H" level to turn on the MOS transistor 44. In contrast, when Icell_total is smaller than IREF, the signal G_CL is set to the "L" level to turn off the MOS transistor 44. Thus, the effect (2), described in the second embodiment, is exerted.

Fourth Embodiment

Now, a semiconductor memory device according to a fourth embodiment of the present invention will be described. The present embodiment corresponds to the above-described second and third embodiments in which during the first read of data of the lowest read level or the erase verification, the precharge level of the bit line BL is reduced regardless of the magnitude of the current Icell_total. Only differences from the second and third embodiments will be described below.

FIG. 25 is a block diagram of the NAND flash memory 1 according to the present embodiment. The configuration of the NAND flash memory 1 according to the present embodiment corresponds to the configurations in FIGS. 18 and 24 described in the second and third embodiments, respectively, and in which the detection circuit 70 is omitted and the arrangement of the bit line driver 40 is altered such that the core control circuit 90 controls operation of the bit line driver 40.

As shown in FIG. 25, the bit line driver 40 according to the present embodiment corresponds to the arrangements in FIGS. 18 and 24 described in the second and third embodiments, respectively, and in which the comparator 45 is omitted. The signal G_CL is provided to the core control circuit 90 based on an instruction from the sequencer 80. The other arrangements are similar to those of the second and third embodiments and will thus not be described below.

<Operations of the Bit Line Driver 40, the Sequencer 80, and the Core Control Circuit 90>

Figure 26:
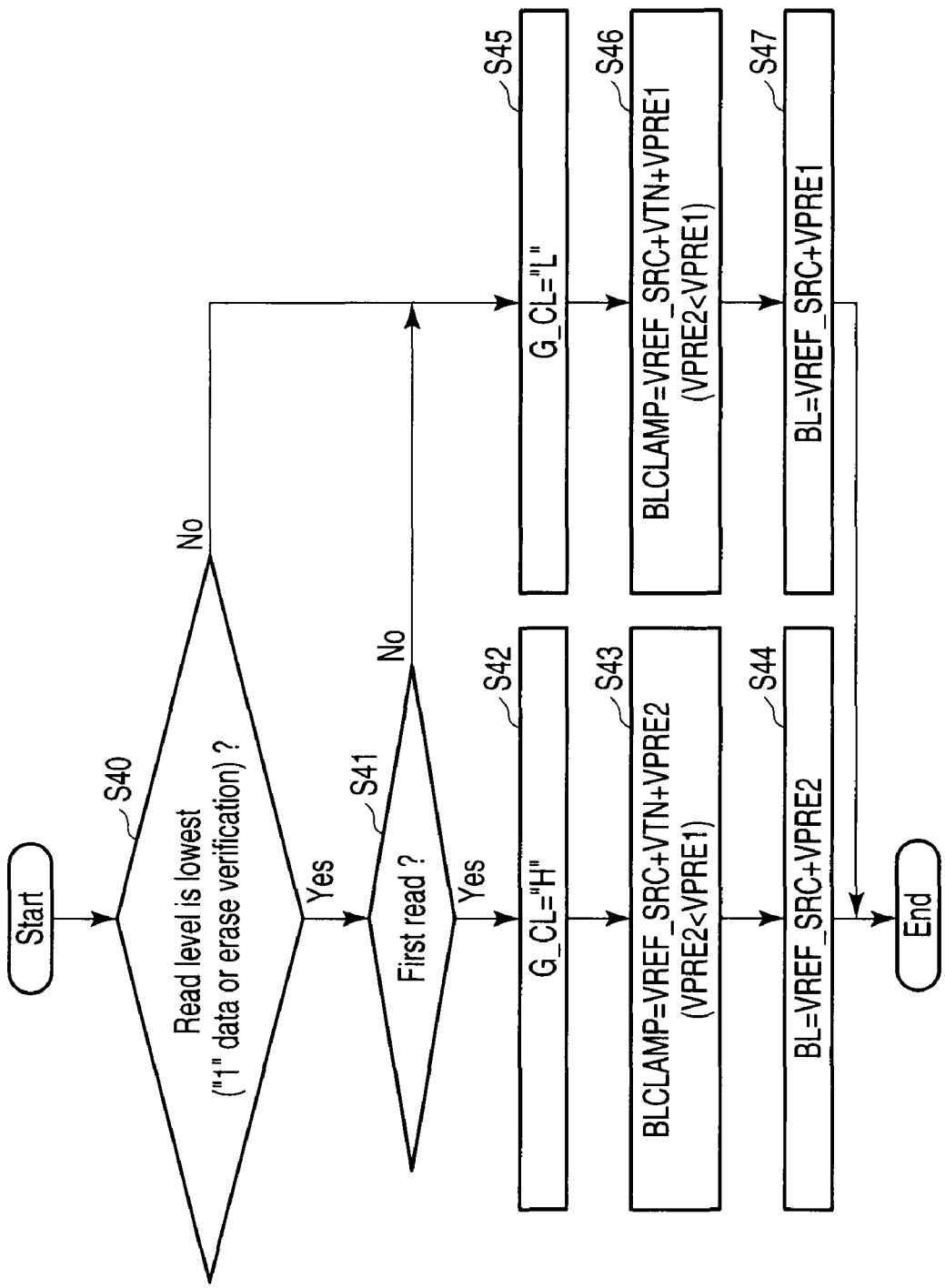
FIG. 26 is a flowchart showing operation of the flash memory according to the fourth embodiment.

Now, the operations of the bit line driver 40, the sequencer 80, and the core control circuit 90 will be described with reference to FIG. 26. FIG. 26 is a flowchart showing the operations of the bit line driver 40, the sequencer 80, and the core control circuit 90. The flowchart corresponds to the processing including step S11 and the subsequent steps in FIG. 19 described in the second embodiment.

As shown in FIG. 26, when the read level of the data is lowest (that is, data with the lowest threshold voltage, corresponding to one level above a erase state, in other words, the "1" data) or during the erase verify operation (step S40, YES) and if the first read is being performed (step S41, YES), the sequencer 80 instructs the core control circuit 90 to set the signal G_CL to the "H" level. In response to this instruction, the core control circuit 90 sets the signal G_CL to the "H" level (step S42).

As a result, as described in the second embodiment, the MOS transistor 44 is turned on to set BLCLAMP= (VREF_SRC+VTN+VPRE2) (step S43). The potential of the bit line BL is set to (VREF_SRC+VPRE2) (step S44).

On the other hand, when the erase verify operation is not being performed or the read level of the data is not lowest (that is, the "2" to "7" data; step S40, NO) or if the read operation is not the first one (step S41, NO), the sequencer 80 instructs the core control circuit 90 to set the signal G_CL to the "L" level. In response to this instruction, the core control circuit 90 sets the signal G_CL to the "L" level (step S45).

As a result, as described in the second embodiment, the MOS transistor 44 is turned off to set BLCLAMP= (VREF_SRC+VTN+VPRE1) (step S46). The potential of the bit line BL is set to (VREF_SRC+VPRE1) (step S47).

Figure 27:
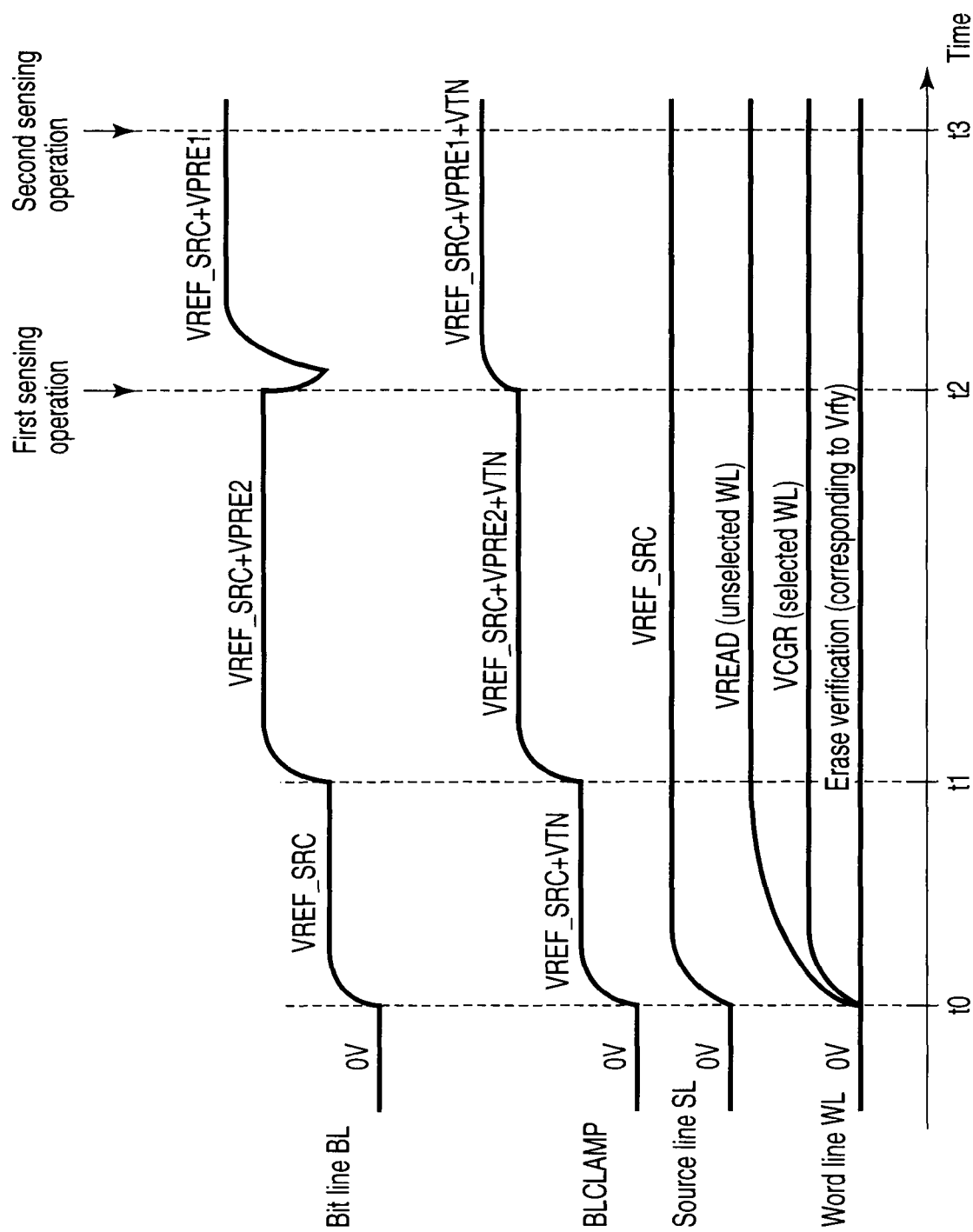
FIG. 27 is a timing chart of various voltages during the read operation in the flash memory according to the fourth embodiment.

FIG. 27 is a timing chart showing variations in the voltages of various signals observed during the erase verify operation or when the "1" data is read. The figure shows the voltages of the bit line BL, the signal BLCLAMP, the source line SL, and the word line WL.

As shown in FIG. 27, variations in the potentials of the word line WL and the source line SL are similar to those shown in FIG. 20 described in the second embodiment. The present embodiment is different from the second embodiment in two ways. That is, when the "1" data is subjected to the first read, BLCLAMP is fixed to (VREF_SRC+VTN+VPRE2) to fix the bit line potential to (VREF_SRC+VPRE2). During the second read (and although not shown in the drawings, during the read of the "2" data and the subsequent reads), BLCLAMP is fixed to (VREF_SRC+VTN+VPRE1) to fix the bit line potential to (VREF_SRC+VPRE1).

That is, regardless of the magnitude of the current Icell_total flowing through the source line SL, the potential of the bit line BL during the first sensing on the "1" data is set to a value smaller than those set during the subsequent reads.

<Effects>

As described above, the semiconductor memory device according to the fourth embodiment of the present invention is effective as follows.

(3) The Above-Described Effect (2) is Exerted Using the Simple Circuit Configuration.

The read operation with the largest total cell current Icell_total is typically the first read of data of the lowest read level, that is, the "1" data. In this case, Icell_total is most likely to exceed the upper limit value because a current from a cell in an erase state flows. In contrast, during the second read of the data corresponding to the lowest read level and during a read performed after the second read for the lowest level to read data with a threshold voltage higher than the lowest level, the value of Icell_total is relatively small.

Thus, in the present embodiment, regardless of the total cell current, the potential (VREF_SRC+VPRE2) of the bit line BL during the first read of the "1" data is set to be lower than the potential (VREF_SRC+VPRE1) of the bit line BL during the subsequent read. Thus, during the first read of the "1" data, the gate-source voltage Vgs and drain-source voltage Vds of the memory cell transistor are suppressed. This enables Icell_total to be prevented from exceeding the upper limit value. During the subsequent reads, the value of Icell_total is relatively small and is thus almost prevented from exceeding the upper limit value in a practical sense even if the potential of the bit line BL is set to (VREF_SRC+VPRE1). Therefore, an effect similar to the effect (1), described in the above-described first embodiment, is exerted.

Furthermore, the present embodiment eliminates the need to monitor the current Icell_total and thus the need to control the potential of BLCLAMP in accordance with Icell_total. This enables the above-described effect to be exerted while simplifying the arrangement of the bit line driver 40.

In the above description, it is assumed that the first read target data in the read sequence starts with the "1" data. Thus, if the first read target data is the "4" data, the total cell current is maximized during the first read of the "4" data. That is, the cell current is maximized during the first read of the first read target data during the data read operation (read sequence). This also applies to the description below. Thus, in such a case, the potential of the bit line BL may be set to (VREF_SRC+VPRE2).

Fifth Embodiment

Now, a semiconductor memory device according to a fifth embodiment of the present invention will be described. The present embodiment is a combination of the first embodiment with the second or third embodiment.

Figure 28:
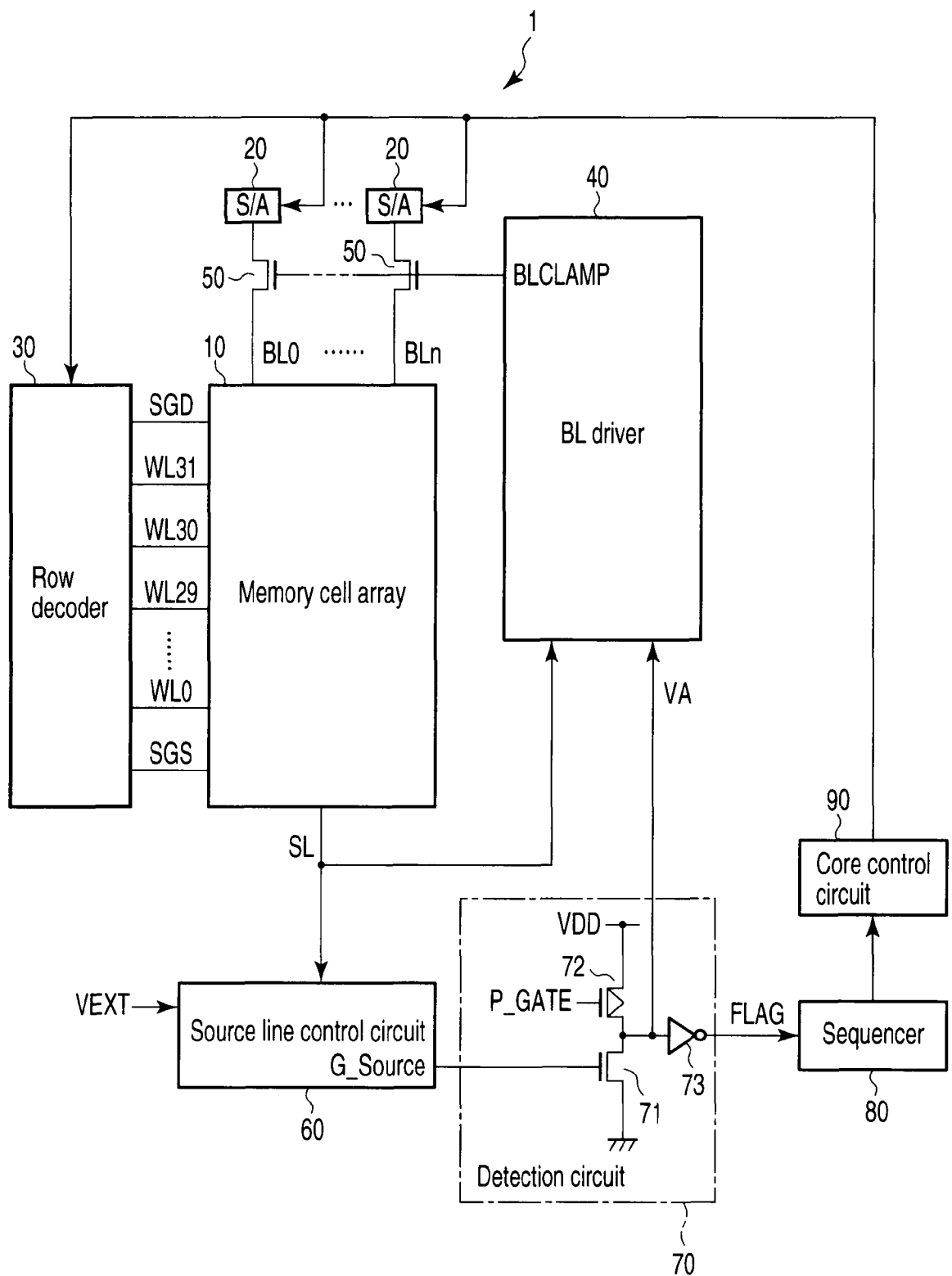

FIG. 28 is a block diagram of a NAND flash memory according to a fifth embodiment of the present invention. As shown in FIG. 28, the NAND flash memory 1 includes the memory cell array 10, the sense amplifier 20, the row decoder 30, the bit line driver 40, the MOS transistor 50, the source line control circuit 60, the detection circuit 70, the sequencer 80, and the core control circuit 90.

The arrangements and operations of the memory cell array 10, the sense amplifier 20, the row decoder 30, the MOS transistor 50, the source line control circuit 60, detection circuit 70, sequencer 80, and the core control circuit 90 are as described in the first embodiment.

On the other hand, the bit line driver 40 has the arrangement in FIG. 18 described in the second embodiment or the arrangement in FIG. 24 described in the third embodiment. That is, the bit line driver 40 compares the voltage VA output by the detection circuit 70 with the reference voltage VREF or the voltage VB to control BLCLAMP depending on the result of the comparison.

The operation of the NAND flash memory 1 according to the present embodiment corresponds to combination of the flowchart in FIG. 12 described in the first embodiment with the flowchart in FIG. 19 described in the second embodiment. That is, when the cell current Icell_total exceeds the upper limit value IREF, the sequencer 80 determines a plurality of times of reading the same data. At the same time, the bit line driver 40 turns on the MOS transistor 44 to reduce the precharge level of the bit line BL.

<Effects>

The configuration according to the present embodiment enables a reduction in read time, and allows an excessive increase in cell current Icell_total to be prevented. That is, the present embodiment can exert both the effect (1), described in the first embodiment, and the effect (2), described in the second embodiment.

Sixth Embodiment

Now, a semiconductor memory device according to a sixth embodiment will be described. The present embodiment is a combination of the above-described first embodiment with the above-described fourth embodiment. FIG. 29 is a block diagram of a NAND flash memory according to the present embodiment.

The NAND flash memory 1 according to the present embodiment corresponds to the configuration described above in the first embodiment and in which the bit line driver 40 is replaced with the one described in the fourth embodiment. That is, in FIG. 29, the arrangements and operations of the memory cell array 10, the sense amplifier 20, the row decoder 30, the MOS transistor 50, the source line control circuit 60, the detection circuit 70, the sequencer 80, and the core control circuit 90 are as described in the first embodiment.

On the other hand, the bit line driver 40 has the arrangement in FIG. 25 described in the fourth embodiment. That is, the bit line driver 40 controls BLCLAMP according to the signal G_CL provided by the core control circuit 90.

The operation of the NAND flash memory 1 according to the present embodiment corresponds to combination of the flowchart in FIG. 12 described in the first embodiment with the flowchart in FIG. 26 described in the fourth embodiment. That is, the sequencer 80 determines the number of reads of the same data depending on whether or not the cell current Icell_total exceeds the upper limit value. The bit line driver 40 the bit line driver turns on the MOS transistor 44 to reduce the precharge level of the bit line BL only during the first read operation of the "1" data or the erase verification.

<Effects>

The configuration according to the present embodiment enables a reduction in read time, and allows an excessive increase in cell current Icell_total to be prevented. That is, the present embodiment can exert both the effect (1), described in the first embodiment, and the effect (3), described in the third embodiment.

Seventh Embodiment

Now, a semiconductor memory device according to a seventh embodiment will be described. The present embodiment corresponds to any of the first to sixth embodiments in which the potential of the source line SL is controlled in accordance with the cell current Icell_total. Only differences from the first to sixth embodiments will be described below.

<Arrangements of the Source Line Control Circuit 60 and the Detection Circuit 70>

FIG. 30 is a circuit diagram of the source line control circuit 60 and the detection circuit 70 according to the present embodiment. As shown in FIG. 30, the detection circuit 70 has the arrangement in FIG. 1 described in the first embodiment and further includes an n-channel MOS transistor 74.

A gate of the MOS transistor 74 is connected to the output node of the inverter 73 (that is, the flag FLAG is input to the gate of the MOS transistor 74). A source of the MOS transistor 74 is grounded. A drain of the MOS transistor 74 is connected to the node G_Source.

The source line control circuit 60 has the arrangement in FIG. 1 described in the first embodiment and includes the MOS transistor 65 with the gate (node G_Source) controlled in accordance with the comparison result from the comparator 64 and the drain potential of the MOS transistor 74.

<Operations of the Source Line Control Circuit 60 and the Detection Circuit 70>

Now, the operations of the source line control circuit 60 and the detection circuit 70 during the read operation and the verify operation will be described with reference to FIG. 31. FIG. 31 is a flowchart showing the operations of the source line control circuit 60 and the detection circuit 70 during the read operation and the verify operation.

As shown in FIG. 31, after step S11 described in the first embodiment, if the current exceeds the reference current Iref (step S12, YES), the output node (FLAG) of the inverter 73 is set to the "H" level. Thus, the MOS transistor 74 is turned on (step S50). Consequently, the potential of the node G_Source decreases. As a result, a driving force of the MOS transistor 65 decreases. Then, the current Icell_total decreases to the upper limit value which is acceptable current value in the source line SL. The potential of the source line SL rises above VREF_SRC and finally reach a value matched with the upper limit value of the current Icell_total (step S51).

On the other hand, if the current Icmp does not exceed the reference current Iref (step S12, NO), the output node of the inverter is set to the "L" level. Thus, the MOS transistor 74 is turned off (step S52). Consequently, the potential of the node G_Source is controlled by the output from the comparator 64. As a result, the potential of the source line SL is maintained at VREF_SRC (step S53).

Figure 32:
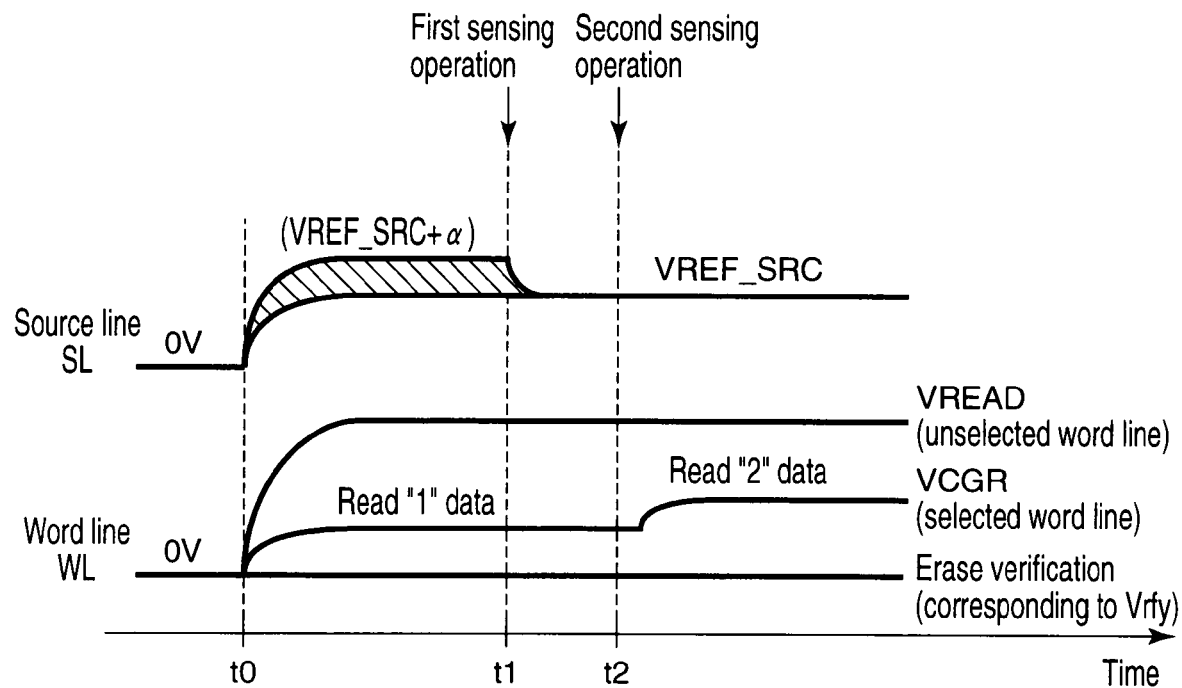
FIG. 32 is a timing chart of various voltages during the read operation in the flash memory according to the seventh embodiment.

The voltages of the source line SL and the word line WL during the above-described read operation and verify operation will be described with reference to FIG. 32. FIG. 32 is a timing chart showing variations in the potentials of the source line SL and the word line WL. Variations in the potentials of the bit line BL, BLCLAMP, the well region 32, and the like are as described in the first to sixth embodiments.

As shown in FIG. 32, at t0, the read operation is started. At time t0, the row decoder 30 applies the voltage VCGR to the selected word line WL. The row decoder 30 applies the voltage VREAD to the unselected word lines WL.

The source line control circuit 60 controls the potential of the source line SL. As described above, if the current Icell_total flowing from the bit line BL to the source line SL does not exceed the upper limit value IREF, the potential of the source line SL is fixed to VREF_SRC. If the current Icell_total exceeds the upper limit value IREF, the potential of the source line SL exhibits a larger value than VREF_SRC. The potential of the source line SL exceeding the upper limit value is shown as a shaded area in FIG. 32.

Thereafter, the precharging, discharging, and sensing are performed as described in the first to sixth embodiments.

<Effects>

As described above, the semiconductor memory device according to the seventh embodiment of the present invention exerts not only the effects (1) to (3), described in the first to sixth embodiment, but also an effect (4).

(4) The Operational Reliability of the NAND Flash Memory can be Improved (Part 2).

The NAND flash memory according to the present embodiment changes the potential of the source line SL in accordance with the detection result for the current Icell_total from the detection circuit 70 to control Icell_total such that Icell_total does not exceed the upper limit value. Thus, the reliability of the NAND flash memory can be improved. The present effect will be described below.

In the configuration according to the present embodiment, if the current Icell_total is small, the gate-source voltage Vgs of the memory cell transistor MT is almost equal to the read level. On the other hand, when the current Icell_total increases, the detection circuit 70 performs feedback control to lower the potential of the node G_Source. As a result, the potential of the source line SL rises. That is, the potential of the source line SL rises from (VREF_SRC) by αV corresponding to the current Icell_total. Thus, compared to the small current Icell_total, the increased current Icell_total prevents sufficient Vgs and Vds from being obtained, as in the case of FIG. 22. A difference between the present configuration and the configuration shown in FIG. 22 is that the detection circuit 70 raises the potential of the source line SL with respect to the bit line BL instead of lowering the potential of the bit line BL with respect to the source line SL. As a result, an increase in current Icell_total is inhibited to enable the current Icell_total to be prevented from exceeding the upper limit value.

Figure 33:
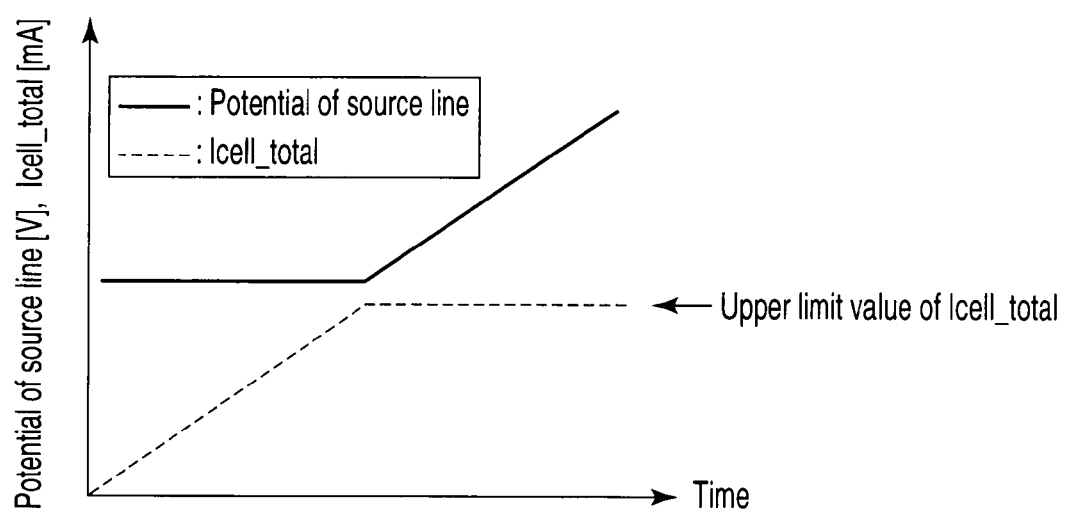
FIG. 33 is a graph showing a relationship between the potential of a source line and the total cell current in the flash memory according to the seventh embodiment.

FIG. 33 is a graph showing variations in the potential of the source line SL and the current Icell_total. As shown in FIG. 33, in the present embodiment, once the current Icell_total reaches the upper limit value, the potential of the node G_Source starts to decrease. Thus, a further increase in current Icell_total is inhibited. Accordingly, when the current Icell_total starts to be inhibited, the potential of the source line SL starts to rise.

Eight Embodiment

Now, a semiconductor memory device according to an eighth embodiment of the present invention will be described. The present embodiment corresponds to the seventh embodiment in which the potential of the source line SL is raised during the erase verification or the first read of data of the lowest read level, regardless of the magnitude of the current Icell_total.

FIG. 34 is a circuit diagram of the source line control circuit 60 and the detection circuit 70 according to the present embodiment. As shown in FIG. 34, the arrangements of the source line control circuit 60 and the detection circuit 70 are similar to those in the first embodiment. A difference between the present embodiment and the first embodiment is that the voltage input to the inversion input terminal of the voltage comparison section 64 of the source line control circuit 60 can be changed between VREF_SRC1 and VREF_SRC2 by the core control circuit 90. In this case, VREF_SRC1<VREF_SRC2. The core control circuit 90 selects one of VREF_SRC1 and VREF_SRC2 in accordance with an instruction from the sequencer 80.

<Operations of the Source Line Control Circuit 60, the Sequencer 80, and the Core Control Circuit 90>

Figure 35:
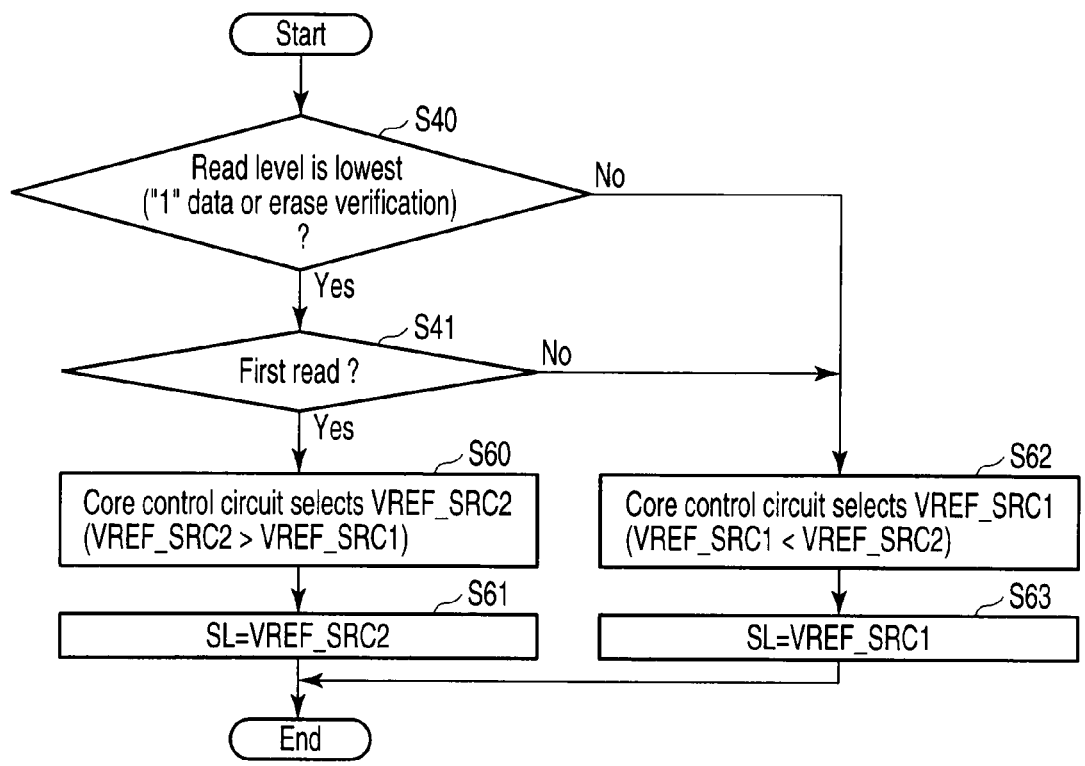
FIG. 35 is a flowchart showing operation of the flash memory according to the eighth embodiment.

Now, the operations of the source line control circuit 60, the sequencer 80, and the core control circuit 90 will be described with reference to FIG. 35. FIG. 35 is a flowchart showing the operations of the source line control circuit 60, the sequencer 80, and the core control circuit 90. The flowchart corresponds to the processing from step S11 and the subsequent steps described in the first embodiment.

As shown in FIG. 35, when the read level is lowest or during the erase verify operation (step S40, YES) and if the first read is being performed (step S41, YES), the sequencer 80 instructs the core control circuit 90 to select VREF_SRC2. In response to this instruction, the core control circuit 90 supplies VREF_SRC2 to the voltage comparison section 64 of the source line control circuit 60 (step S60). Thus, the potential of the source line SL is set to VREF_SRC2 (step S61).

On the other hand, when the erase verify operation is not being performed or the read level of the data is not lowest (step S40, NO) or if the read operation is not the first one (step S41, NO), the sequencer 80 instructs the core control circuit 90 to select VREF_SRC1. In response to this instruction, the core control circuit 90 supplies VREF_SRC1 to the voltage comparison section 64 of the source line control circuit 60 (step S62). Thus, the potential of the source line SL is set to VREF_SRC1 (step S63).

Figure 36:
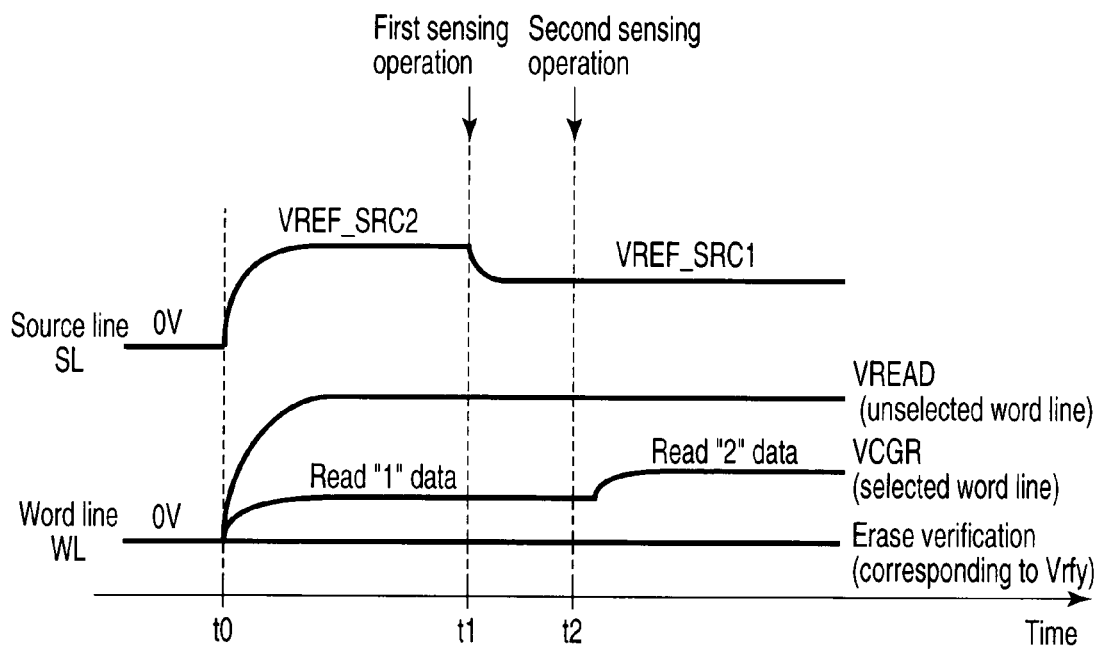
FIG. 36 is a timing chart of various voltages during the read operation in the flash memory according to the eighth embodiment.

FIG. 36 is a timing chart showing variations in the voltages of various signals observed during the erase verify operation or when the "1" data is read. The figure shows the voltages of the bit line BL, the signal BLCLAMP, the source line SL, and the word line WL.

As shown in FIG. 36, unlike in the case of the seventh embodiment, the potential of the source line SL is fixed to VREF_SRC2 during the first read of the "1" data (or the erase verification). That is, regardless of the magnitude of the current Icell_total flowing through the source line SL, the potential of the source line SL is fixed to the value (VREF_SRC2), which is higher than the potential (VREF_SRC1), set during the subsequent read.

<Effects>

As described above, the semiconductor memory device according to the eighth embodiment of the present invention exerts not only the effects (1) to (3), described in the first to sixth embodiment, but also an effect (5).

(5) The Effect (4) can be Exerted Using a Simple Circuit Configuration.

As described above in the fourth embodiment, the first read of the "1" data is the read operation involving the largest total cell current Icell_total. In this case, Icell_total is most likely to exceed the upper limit value because a current from a cell in the erase state flows.

Thus, in the present embodiment, regardless of the total cell current Icell_total, the potential (VREF_SRC2) of the source line SL during the first read of the "1" data is set to be higher than the potential (VREF_SRC1) of the source line SL during the subsequent read. This also applies to the erase verification. Thus, during the first read of the "1" data, the gate-source voltage Vgs of the memory cell transistor is suppressed. This enables Icell_total to be prevented from exceeding the upper limit value. Therefore, an effect similar to the effect (1), described in the first embodiment, is exerted.

Furthermore, the present embodiment eliminates the need to control the potential of the node G_Source in accordance with Icell_total. Therefore, the present embodiment exerts the above-described effect while simplifying the configuration of the source line control circuit 60.

As described in the fourth embodiment, for example, if the first read target data is the "4" data, the total cell current is maximized during the first read of the "4" data. That is, the cell current is maximized during the first read of the first read target data during the data read operation. Thus, in such a case, the potential of the source line SL may be set to (VREF_SRC2).

As described above, the semiconductor memory device according to the first to eighth embodiment of the present invention includes the detection circuit 70, which detects the current Icell_total flowing through the source line SL during the data read operation and the verify operation. Then, depending on the detection result from the detection circuit 70, the sense amplifier 20 and the bit line driver 40 are controlled. As a result, the operational performance of the NAND flash memory can be improved.

That is, in the configuration according to the first embodiment, the sense amplifier 20 determines the number of sensing operations on the same data, depending on the amount of current detected by the detection circuit 70. That is, inside the chip, the total cell current Icell_total is monitored. The result of the monitoring is fed back to allow determination of whether or not to perform the next sensing operation. More specifically, if a large total cell current flows during a single sensing operation, the sensing operation is performed again at the same level. On the other hand, if the total cell current is small, the sensing operation of this data is completed. This method enables a reduction in the number of sensing operations required for the read or verification. This enables an increase in the operating speed of the NAND flash memory.

In the configurations according to the second to fourth embodiments, the bit line driver 40 controls the precharge potential of the bit line depending on the amount of current detected by the detection circuit 70. That is, inside the chip, the total cell current Icell_total is monitored. The result of the monitoring is fed back to the bit line precharge potential. Finally, Vds of the memory cell transistor MT is changed. As a result, the total cell current Icell_total is controlled so as not to exceed the upper limit value IREF. More specifically, if the total cell current is large, the bit line precharge potential is lowered from the original set value to reduce Vds. In contrast, if the total cell current is small, the bit line precharge potential remains at the original set value. This control automatically prevents an operating current for the chip from exceeding an allowable current specification. Moreover, a bias condition of the memory cell transistor MT is also automatically controlled. This enables a reduction in time and effort required for optimization based on means such as tests.

In the configurations according to the seventh and eighth embodiments, the source line control circuit 60 controls the potential of the source line depending on the amount of current detected by the detection circuit 70. That is, inside the chip, the total cell current Icell_total is monitored. The result of the monitoring is fed back to the source line potential. More specifically, if the current amount exceeds the preset upper limit threshold, the current driving force of the MOS transistor, which allows the cell current to flow to the ground potential, is reduced. Thus, the potential of the source line SL is raised to lower Vgs of the memory cell transistor MT. This prevents the amount of current flowing through the source line SL from exceeding the upper limit threshold.

In the configurations according to the fifth to eighth embodiments, the number of sensing operations is controlled in accordance with the cell current, and the potential of the bit line and/or the source line is controlled in accordance with the cell current as described above. Thus, both the operating speed and reliability of the NAND flash memory can be improved.

In the above description of the embodiments, the positive voltage VREF_SRC is applied to the source line SL regardless of the read level. However, VREF_SRC may be applied to the source line SL only to read data of a negative read level, and the potential of the source line SL may otherwise be set to 0V.

To achieve this, for example, the bit line driver 40 is provided with a switch element. If the read level is negative, the switch element may be used to connect the other end of the resistance element 43 to the source line SL. If the read level is not negative, the switch element may be used to connect the other end of the resistance element 43 to a ground level (0V) node. Moreover, the source line control circuit 60 is provided with a switch element. Then, if the read level is negative, the switch element may be used to connect the node G_Source to the comparator 64. If the read level is not negative, the switch element is used to connect the node G_Source to the "H" level to keep the MOS transistor 65 on.

However, a method of applying VREF_SRC to the source line SL for all the data (all the read level) eliminates the need for the switching process corresponding to the read level. This allows the arrangements of the bit line driver 40 and the source line control circuit 60 to be simplified and enable an increase in operating speed. Furthermore, using the same read method for all the data enables a reduction in the interval between the threshold distributions. That is, if the read method is changed depending on whether or not the read level is negative, then for the threshold distribution in FIG. 3, the interval between the threshold distribution of the "1" data and the threshold distribution of the "2" data needs to be larger than those between the other data. However, using the same read method for all the data eliminates this need.

Moreover, in the above-described embodiments, the gate width W2 of the MOS transistor 71 is smaller than the gate width W1 of the MOS transistor 65 by way of example. This enables a reduction in the current flowing through the MOS transistors 71 and 72 and thus in the current consumption of the detection circuit 70. However, if the current consumption is not problematic, the gate widths may be set such that W1=W2.

Moreover, in the above-described embodiments, only one data ("1" data) other than the erase level ("0" data) has a negative read level. However, of course, two or more data other than the erase level may have negative read levels. Furthermore, the above-described embodiments relates to the NAND flash memory by way of example. However, the embodiments are applicable to, for example, a NOR flash memory, and to semiconductor memory devices in general, in which the source line voltage disadvantageously rises as a result of an increase in cell current.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
a memory cell including a charge accumulation layer and a control gate and configured to hold 2 or more levels of data;
a bit line electrically connected to a drain of the memory cell;
a source line electrically connected to a source of the memory cell; and
a detection circuit which detects a current flowing through the source line during a read operation and a verify operation of the data; and
a sense amplifier which reads the data by sensing a current flowing through the bit line during the read operation and the verify operation, whether or not the sense amplifier reads a same data plural times being determined according to a current amount detected by the detection circuit.

2. The device according to claim 1, wherein
the detection circuit compares the current flowing through the source line with a reference current, and
when the sense amplifier reads one of the levels of the data,
if the current flowing through the source line is larger than the reference current, the sense amplifier senses the current flowing through the bit line plural times, and
if the current flowing through the source line is smaller than the reference current, the sense amplifier senses the current flowing through the bit line once.

3. The device according to claim 1, further comprising:
a bit line driver which, during the read operation and the verify operation, controls a precharge potential of the bit line according to the current amount detected by the detection circuit.

4. The device according to claim 1, further comprising:
a bit line driver which controls a precharge potential of the bit line during the read operation and the verify operation; and
a control circuit which instructs the bit line driver to set the precharge potential during a first read of plural times regarding a lowest one of the levels of the data to a first potential, and to set the precharge potential during a subsequent read to a second potential which is higher than the first potential.

5. The device according to claim 4, wherein
the control circuit instructs the bit line driver to set the precharge potential during erase verification to the first potential.

6. The device according to claim 1, further comprising:
a source line control circuit which, during the read operation and the verify operation, controls a potential of the source line according to the current amount detected by the detection circuit.

7. The device according to claim 6, wherein
the source line control circuit limits the current flowing through the source line when the current amount exceeds a preset given value.

8. The device according to claim 1, further comprising:
a source line control circuit which controls a potential of the source line during the read operation and the verify operation, wherein
the source line control circuit instructs the bit line driver to set the potential of the source line during a first read of plural times regarding a lowest one of the levels of the data to a first potential, and to set the potential of the source line during a subsequent read to a second potential which is lower than the first potential.

9. The device according to claim 1, further comprising:
a source line control circuit which controls a potential of the source line during the read operation and the verify operation, wherein
the source line control circuit includes a first MOS transistor having a current path with one end connected to the source line, and
the detection circuit includes a second MOS transistor having a gate connected to a gate of the first MOS transistor and a third MOS transistor having a gate to which a predetermined potential is provided and a current path with one end connected to the one end of the current path of the first MOS transistor, and the detection circuit outputs a potential of a connection node between the second MOS transistor and the third MOS transistor as a flag.

10. The device according to claim 9, wherein
a gate width of the second MOS transistor is smaller than that of the first MOS transistor.

11. The device according to claim 1, wherein
the memory cell is configured to hold data of at least 4 levels of the data, and
a read level of two or more levels of data is negative.

12. The device according to claim 1, wherein
when one of the levels of the data with a negative read level is read, a positive potential is applied to the source line.

13. A semiconductor memory device comprising:
a memory cell including a charge accumulation layer and a control gate and configured to hold 2 or more levels of data;
a bit line electrically connected to a drain of the memory cell;
a sense amplifier which reads the data by sensing a current flowing through the bit line during a read operation and a verify operation of the data;
a transistor which connects the bit line to the sense amplifier;
a source line electrically connected to a source of the memory cell; and
a detection circuit which detects a current flowing through the source line during the read operation and the verify operation of the data; and
a bit line driver which, during the read operation and the verify operation, controls a gate potential of the transistor to control a precharge potential of the bit line according to a current amount detected by the detection circuit.

14. The device according to claim 13, wherein
when the current amount detected by the detection circuit exceeds a preset given value, the bit line driver sets the precharge potential to be lower than when the current amount does not exceed the given value.

15. The device according to claim 13, further comprising:
a source line control circuit which, during the read operation and the verify operation, controls a potential of the source line according to the current amount detected by the detection circuit.

16. The device according to claim 15, wherein
the source line control circuit limits the current flowing through the source line when the current amount exceeds a preset given value.

17. The device according to claim 13, further comprising:
a source line control circuit which controls a potential of the source line during the read operation and the verify operation, wherein
the sense amplifier reads a same data plural times, and
the source line control circuit sets the potential of the source line during a first read of plural times regarding a lowest one of the levels of the data to a first potential, and sets the potential of the source line during a subsequent read to a second potential which is lower than the first potential.

18. A semiconductor memory device comprising:
a memory cell including a charge accumulation layer and a control gate and configured to hold 2 or more levels of data;
a bit line electrically connected to a drain of the memory cell;
a source line electrically connected to a source of the memory cell;
a sense amplifier which reads the data by sensing a current flowing through the bit line during a read operation and a verify operation, the sense amplifier reading a same data plural times;
a bit line driver which controls a precharge potential of the bit line during the read operation and the verify operation; and
a control circuit which instructs the bit line driver to set the precharge potential during a first read of plural times regarding a lowest one of the levels of the data to a first potential, and to set the precharge potential during a subsequent read to a second potential which is higher than the first potential, a potential difference between the first potential and a potential of the source line during the first read being smaller than that between the second potential and the potential of the source line during the subsequent read.

19. The device according to claim 18, wherein
the control circuit instructs the bit line driver to set a precharge potential during erase verification to the first potential.

20. The device according to claim 18, further comprising:
a source line control circuit which controls a potential of the source line during the read operation and the verify operation, wherein
the source line control circuit sets the potential of the source line during the first read of plural times regarding the lowest one of the levels of the data to a third potential, and sets the potential of the source line during the subsequent read to a fourth potential which is lower than the third potential.

* * * * *